(12) United States Patent
Afshari et al.

(10) Patent No.: US 8,698,570 B2
(45) Date of Patent: Apr. 15, 2014

(54) RESONATOR CIRCUIT AND AMPLIFIER CIRCUIT

(75) Inventors: Ehsan Afshari, Ithaca, NY (US); Wooram Lee, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 13/702,444

(22) PCT Filed: Jun. 7, 2011

(86) PCT No.: PCT/US2011/039451
§ 371 (c)(1),
(2), (4) Date: Apr. 3, 2013

(87) PCT Pub. No.: WO2011/156379
PCT Pub. Date: Dec. 15, 2011

(65) Prior Publication Data
US 2013/0207725 A1    Aug. 15, 2013

Related U.S. Application Data

(60) Provisional application No. 61/351,964, filed on Jun. 7, 2010.

(51) Int. Cl.
*H03B 1/00* (2006.01)
(52) U.S. Cl.
USPC ........... 331/167; 331/107 SL; 331/177 V; 331/51; 331/36 C; 331/96; 331/107 DP; 330/286; 333/218; 333/219
(58) Field of Classification Search
USPC ........... 333/219, 218; 331/177 V, 51, 107 SL, 331/96, 107 DP, 36 C, 167; 330/286
See application file for complete search history.

(56) References Cited

U.S. PATENT DOCUMENTS 4,327,343 A * 4/1982 Cornish ..................... 333/218
2007/0087719 A1   4/2007 Mandal et al.

OTHER PUBLICATIONS

Chan et al.; Parametric Conversion Using Custom MOS Varactors; Hindawi Publishing Corporation; EURASIP Journal on Wireless Communications and Networking vol. 2006, 1-16.

(Continued)

*Primary Examiner* — Arnold Kinkead
(74) *Attorney, Agent, or Firm* — William Greener; Bond, Schoeneck & King, PLLC

(57) ABSTRACT

A passive frequency divider in a CMOS process. More specifically, an electrical distributed parametric oscillator to realize a passive CMOS frequency divider with low phase noise. Instead of using active devices, which are the main sources of noise and power consumption, an oscillation at half of the input frequency is sustained by the parametric process based on nonlinear interaction with the input signal. For example, one embodiment is a 20 GHz frequency divider utilizing a CMOS varactor and made in a 0.13 μm CMOS process. In this embodiment: (i) without any dc power consumption, 600 mV differential output amplitude can be achieved for an input amplitude of 600 mV; and (ii) the input frequency ranged from 18.5 GHz to 23.5 GHz with varactor tuning. In this embodiment, the output phase noise is almost 6 dB lower than that of the input signal for all offset frequencies up to 1 MHz. Also, a resonant parametric amplifier with a low noise figure (NF) by exploiting the noise squeezing effect. Noise squeezing occurs through the phase-sensitive amplification process and suppresses one of two quadrature components in input noise. When the input signal is only in the direction of the non-suppressed quadrature component, squeezing can lower that NF by almost 3 dB. The resonant structure of the proposed amplifier achieves the squeezing effect using a low number of LC elements.

16 Claims, 18 Drawing Sheets

(56) References Cited

OTHER PUBLICATIONS

Magierowski et al.; RF CMOS Parametric Downconverters; IEEE Transactions on Microwave Theory and Techniques, vol. 58, No. 3, Mar. 2010, 518-528.

George R. Sloan; The Modeling, Analysis, and Design of Filter-Based Parametric Frequency Dividers; IEEE Transactions on Microwave Theory and Techniques, vol. 41, No. 2, Feb.

* cited by examiner

RESONATOR CIRCUIT AND AMPLIFIER CIRCUIT

RELATED APPLICATION

The present application claims priority to U.S. provisional patent application No. 61/351,964, filed on Jun. 7, 2010; all of the foregoing patent-related document(s) are hereby incorporated by reference herein in their respective entirety(ies).

FEDERALLY SPONSORED RESEARCH OR DEVELOPMENT

The U.S. Government grant(s) relating to this invention that may be required to be set forth in this document are as follows: CAREER award Grant No. 0954537 awarded by the National Science Foundation.

BACKGROUND OF THE INVENTION

1. Field of the Invention

The present invention relates to circuitry for resonators, frequency dividers and/or resonant amplifiers and more particularly to a passive complementary metal-oxide semiconductor (CMOS) resonator used as a frequency divider and a low noise parametric resonant amplifier.

2. Description of the Related Art

The frequency divider is an essential block in phase-locked loops (PLLs) and frequency synthesizers. The design of the frequency divider block in any system is critical, since it consumes a large portion of the overall system power and it is one of the key contributors to the phase noise. It is known that design of the frequency divider becomes even more challenging at high frequencies due to the limited speed of digital gates in a conventional digital frequency divider. At these frequencies an injection-locked frequency divider has been a good candidate due to its high speed and low power consumption. Although there have been several works to further minimize the power consumption of the injection-locked frequency divider, the use of transistors for sustaining oscillation limits these efforts. Moreover, the channel noise caused by transistors degrades the output phase noise at a large offset frequency or near the edge of the locking range.

There have recently been a few works on parametric frequency dividers on printed circuit boards (PCB). However, the operation frequency is limited to a maximum 2 gigahertz (GHz) and these frequency dividers cannot be implemented in a CMOS process.

In an RF receiver front end, a low noise amplifier (LNA) is a potentially important block because it mainly determines the noise figure (NF) of the entire system. There have been many previous efforts to minimize the NF of LNAs in a CMOS process. A source-degenerated CMOS LNA is one of the most prevalent structures, which achieves input matching without a real resistor and exploits an input resonant network for signal amplification. A $g_M$-boosted LNA and positive feedback LNA are also attractive modifications of a conventional common-gate CMOS LNA. In another approach, a sub-0.2-dB NF CMOS LNA was implemented with a non-50Ω signal-source impedance. However, no linear amplifier can achieve NF below 0 dB, because input noise is amplified by the same gain as the signal, and additional noise sources associated with the loss exist in the input matching network and the intrinsic active device noise.

The phenomenon of "noise squeezing" was originally studied in optics for precise measurements constrained by the uncertainty principle, which sets a fundamental limit to the simultaneous observation of two conjugate parameters, such as the photon number and its phase. Because the uncertainty principle preserves the multiplication of the variances of two conjugate parameters, a degenerate parametric amplifier can suppress one of the quadrature noise components at the expense of amplifying the other quadrature component through phase-sensitive amplification.

Noise squeezing was also demonstrated in the mechanical and electrical systems as classical analogues of optical systems to beat the thermal noise limitation. Specifically, Josephson's parametric amplifier using a superconducting quantum interference device (SQUID) was designed to implement noise squeezing in an electrical system. However, this amplifier requires a very low operation temperature (around 0 K) and is not integrable on a chip.

The following published documents may also include helpful background information: 1) A. M. Niknejad and H. Hashemi, mm-Wave Silicon Technology: 60 GHz and Beyond, Springer, 2008; (2) S. Rong, A. W. Ng, and H. C. Luong, "0.9 mW 7 GHz and 1.6 mW 60 GHz Frequency Dividers with Locking-Range Enhancement in 0.13 um CMOS," in IEEE ISSCC Dig. Tech. Papers, February 2009, pp. 96-97; (3) K. H. Tsai, L. C. Cho, J. H. Wu, and S. I. Lu, "3.5 mW W-Band Frequency Divider with Wide Locking Range in 90 nm CMOS Technology," in IEEE ISSCC Dig. Tech. Papers, February 2008, pp. 466-467; (4) Q. Gu, Z. Xu, D. Huang, et al., "A Low Power V-Band CMOS Frequency Divider With Wide Locking Range and Accurate Quadrature Output Phases," IEEE J. Solid-Stat Circuits, vol. 43, no. 4, pp. 991-998, April 2008; (5) H. R. Rategh and T. H. Lee, "Superharmonic Injection-Locked Frequency Dividers," IEEE J. Solid-Stat Circuits, vol. 34, no. 6, pp. 813-821, June 1999; (6) B. Razavi, "A Study of Injection Locking and Pulling in Oscillators," IEEE J. Solid-Stat Circuits, vol. 39, no. 9, pp. 1415-1424, September 2004; (7) B. Razavi, "Heterodyne Phase Locking: A Technique for High-Speed Frequency Division," IEEE J. Solid-Stat Circuits, vol. 42, no. 12, pp. 2887-2892, December 2007; (8) W. H. Louisell, Coupled mode and Parametric electronics, Wiley, New York, N.Y., 1960; (9) R. Landauer, "Parametric Amplification Along Nonlinear Transmission Lines," Journal of Applied Physics, vol. 31, pp. 479-484, 1960; (10) G. R. Sloan, "The Modeling, Analysis, and Design of Filter-Based Parametric Frequency Dividers," IEEE Trans. MTT, vol. 55, no. 10, pp. 224-228, February 1993; (11) A. Suarez and R. Melville, "Simulation-Assisted Design and Analysis of Varactor-Based Frequency Multipliers and Dividers," IEEE Trans. MTT, vol. 54, no. 3, pp. 1166-1179, March 2006; (12) Z. Heshmati, I. C. Hunter, and R. D. Pollard, "Microwave Parametric Frequency Dividers With Conversion Gain," IEEE Trans. MTT, vol. 41, no. 2, pp. 2059-2064, October 2007; (13) A. Yariv, W. H. Louisell, "Theory of the Optical Parametric Oscillator," IEEE J. of Quantum Electronics, vol. QE-2, no. 9, pp. 418-424, September 1966; (14) S. E. Harris, "Tunable Optical Parametric Oscillators," Proc. IEEE, vol. 57, no. 12, December 1969; (15) P. K. Tien and H. Suhl, "A Traveling-wave Ferromagnetic Amplifier," Proc. IRE, vol. 46, pp. 700-706, April 1958; (16) P. K. Tien, "Parametric Amplification and Frequency Mixing in Propagating circuits," Journal of Applied Physics, vol. 29, no. 9, pp. 1347-1357, September 1958; (17) CMRF8SF Model Reference Guide, IBM Microelectronics Division, April 2007; (18) L. E. Myers, R. C. Eckardt, M. M. Fejer, and R. L. Byer, "Quasi-Phase-Matched Optical Parametric Oscillators in Bulk Periodically Poled LiNbO3," J. Opt. Soc. Am. B, vol. 12, no. 11, pp. 2102-2116, November 1995; (19) D. M. Pozar, Microwave Engineering, Wiley, New York, N.Y., 2005; (20) G. M. Roe and M. R. Boyd, "Parametric Energy Conversion in Distributed Systems," Proc. IRE, vol. 47, pp. 1213-1218, July 1959; (21) D. Ham and A. Hajimiri, "Concepts and Methods in Optimization of Integrated LC VCOs," IEEE J. Solid-Stat Circuits, vol. 36, no. 6, pp. 896-09, June 2001; (22) H. Brauns and W. Konrath, "Ultra Low Phase Noise Parametric Frequency Divider For Highest Performance Microwave- and Milimeter-wave Frequency Sources," in European Microwave Conference, vol. 2, pp. 1155-1158, October 1995; (23) U. L. Rohde, Microwave and Wireless Synthesizers. Theory and Design, Wiley, New York, N.Y., 1997; (24) Chien-Chih Ho, et al, "0.13-um RF CMOS and Varactors Performance Optimization by Multiple Gate Layouts," IEEE Tran. Electron Devices, vol. 51, no. 12, 2004; (25) D. K. Shaeffer and T. H. Lee, "A 1.5-V, 1.5-GHz CMOS Low Noise Amplifier," IEEE J. Solid-Stat Circuits, vol. 32, no. 5, pp. 745-759, May 1997; (26) X. Li, S. Shekhar, and D. J. Allstot, "Gm-Boosted Common-Gate LNA and Differential Colpitts VCO/QVCO in 0.18-pm CMOS," IEEE J. Solid¬-Stat Circuits, vol. 40, no. 12, pp. 2609-2619, December 2005; (27) A. Liscidini, M. Brandolini, D. Sanzogni, and R. Castello, "A 0.13 pm CMOS Front-End, for DCS1800/UMTS/802.11b-g With Multiband Positive Feedback Low-Noise Amplifier," IEEE J. Solid-Stat Circuits, vol. 41, no. 4, pp. 981-989, April 2006; (28) L. Belostotski and J. W. Haslett, "Sub-0.2 dB Noise Figure Wide-band Room-Temperature CMOS LNA With Non-50C2 Signal-Source Impedance," IEEE J. Solid-Stat Circuits, vol. 42, no. 11, pp. 2492-2502, November 2007; (29) D. Rugar, "Mechanical Parametric Amplification and Thermomechanical Noise Squeezing," Phys. Rev. Lett., vol. 67, no. 6, pp. 699-702, August 1991; (30) R. Almog, "Noise Squeezing in a Nanomechanical Duffing Resonator," Phys. Rev. Lett., doi:10.1103/PhysRevLett.98.078103, February 2007; (31) B. Yurke, "Squeezed-state generation using a Josephson parametric amp¬lifier," J. Opt. Soc. Am. B, vol. 4, no. 10, pp. 1551-1557, October 1987; (32) B. Yurke, "Observation of 4.2-K Equilibrium-Noise Squeezing via a Josephson-Parametric Amplifier," Phys. Rev. Lett., vol. 60, no. 9, pp. 764-767, February 1988; (33) M. A. Castellanos-Beltran, K. D. Irwin, G. C. Hilton, L. R. Vale, and K. W. Lehnert, "Amplification and squeezing of quantum noise with a tunable Josephson metamaterial," Nature, doi: 10.1038/nphys1090, October 2008; (34) Y. Yamamoto, "Characteristics of A1GaAs Fabry-Perot cavity type laser amplifiers," IEEE J. Quantum Electronics, vol. 16, no. 10, pp. 1047-1052, October 1980; (35) E. Afshari and A. Hajimiri, "Nonlinear Transmission Lines for Pulse Shaping in Silicon," IEEE J. Solid-Stat Circuits, vol. 40, no. 3, pp. 744-752, March 2005; (36) W. H. Louisell, Coupled mode and Parametric electronics, Wiley, New York, N.Y., 1960; (37) P. K. Tien and H. Suhl, "A Traveling-wave Ferromagnetic Amplifier," Proc. IRE, vol. 46, pp. 700-706, April 1958; (38) P. K. Tien, "Parametric Amplification and Frequency Mixing in Propagating circuits," Journal of Applied Physics, vol. 29, no. 9, pp. 1347-1357, September 1958; (39) D. M. Pozar, Microwave Engineering, Wiley, New York, N.Y., 2005; (40) J. J. Waterston, "On the physics of media that are composed of free and elastic molecules in a state of motion,". Roy. Soc. Proc. vol. 5: 604, 1846; (41) W. Greiner, L. Neise, and H. Stocker. Thermodynamics and Statistical Mechanics, Springer, New York, N.Y., 1995; (42) CMRF8SF Model reference Guide, IBM Microelectronics Division, April 2007; (43) L. E. Myers, R. C. Eckardt, M. M. Fejer, and R. L. Byer, "Quasi-Phase-¬Matched Optical Parametric Oscillators in Bulk Periodically Poled LiNb03," J. Opt. Soc. Am. B, vol. 12, no. 11, pp. 2102-2116, November 1995; (44) G. M. Roe and M. R. Boyd, "Parametric Energy Conversion in Distributed Systems," Proc. IRE, vol. 47, pp. 1213-1218, July 1959; (45) R. Landauer, "Parametric Amplification Along Nonlinear Transmission Lines," Journal of Applied Physics, vol. 31, pp. 479-484, 1960; (46) Chien-Chih Ho, et al., "0.13-um RF CMOS and Varactors Performance Optimization by Multiple Gate Layouts," IEEE Tran. Electron Devices, vol. 51, no. 12, 2004; (47) "Substrate voltage and accumulation-mode MOS varactor capacitance," by S. A. Wartenberg and J. R. Hauser, Booz Allen Hamilton, Arlington, Va., USA, this paper appears in: IEEE Transactions on Electron Devices, Issue Date: July 2005, Volume: 52, Issue:7, on page(s): 1563-1567, ISSN: 0018-9383, INSPEC Accession Number: 8534822, Digital Object Identifier: 10.1109/TED.2005.850953, Date of Current Version: 27 Jun. 2005; (48) R. Bagheri et al, "An 800-MHz-6-GHz Software-Defined Wireless Receiver in 90-nm CMOS," IEEE J. Solid-Stat Circuits, vol. 41, no. 12, pp. 2860-2876, December 2006; (49) Lim, "Characteristics of process variability and robust optimization of analog circuits," Massachusetts Institute of Technology, 2008; (50) Zhang et al., "A fast programmable frequency divider with a wide-dividing ratio range and 50% duty-cycle," University of Tennessee, Nov. 10, 2007; (51) Cheema et al., "A 40-GHz Phase-Locked Loop for 60-GHz Sliding-IF Transreceivers in 65 nm CMOS," Eindhoven University of Technology, Eindhoven, The Netherlands, Nov. 10, 2010; (52) Laskin et al, "A 95 GHz receiver with fundamental-frequency VCO and static frequency divider in 65 nm digital CMOS," University of Toronto, Toronto, Canada, 2011; (53) U.S. Pat. No. 6,972,635 ("McCorquodale"); (53) U.S. Pat. No. 7,102,446 ("Lee"); (54) U.S. Patent Application 2006/0238261; (55) U.S. Patent; (56) U.S. Pat. No. 7,280,002 ("Loke"); (57) U.S. Pat. No. 7,349,514 ("Meltzer"); and/or (58) U.S. Pat. No. 7,521,976 ("Sudjian").

Description of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

According to one aspect of the present invention, a resonator circuit includes: a pump module; and a resonator portion. The pump module is structured, located, programmed and/or connected to pump alternating current electrical energy to the resonator portion at a wavelength of $\lambda_P$. The resonator portion is structured and/or connected to produce a signal differential standing wave having a wavelength of $\lambda_S$ such that $\lambda_P$ is an integral multiple of $\lambda_S$. The resonator portion is formed in a CMOS process.

According to another aspect of the present invention, a resonator circuit includes: a pump module; a first transmission line; a second transmission line; and a set of capacitor sub-module(s). The first transmission line has a first end and a second end and a plurality of inductive elements located between the first end and the second end. The second transmission line has a first end and a second end and a plurality of inductive elements located between the first end and the second end. The first end of the first transmission line is directly electrically connected to the first end of the second transmission line at a first transmission line connection node. The pump module is structured, located, programmed and/or connected to pump alternating current electrical energy at a wavelength of $\lambda_P$ to the first and second transmission lines at the first transmission line connection node. Each capacitor sub-module of the set of capacitor sub-module(s): (i) includes at least one variable capacitor, and (ii) is electrically connected between the first transmission line and the second transmission line. The first transmission line, the second transmission line and the set of capacitor sub-modules are structured and/or connected to produce a signal differential standing wave having a wavelength of $\lambda_S$ such that $\lambda_P$ is an integral multiple of $\lambda_S$.

According to a further aspect of the present invention, a resonator circuit includes: a pump module; and a plurality of capacitor-inductor modules. Each capacitor-inductor module of the plurality of capacitor-inductor modules comprises a first inductive element, a second inductive element and a capacitor sub-module. The first inductive elements of the plurality of capacitor-inductor modules are electrically connected in series to form a first transmission line. The second inductive elements of the plurality of capacitor-inductor modules are electrically connected in series to form a first transmission line. A first end of the first transmission line is directly electrically connected to a first end of the second transmission line at a first transmission line connection node. The pump module is structured, located, programmed and/or connected to pump alternating current electrical energy at a wavelength of $\lambda_P$ to the first and second transmission lines at the first transmission line connection node. Each capacitor sub-module of the plurality of capacitor-inductor modules comprises two variable capacitors and a fixed capacitor, with the variable capacitors being connected to each other, in series at a common node, between the first and second inductive elements and with the fixed capacitor being electrically connected between the common node and an electrical ground. The variable capacitors, the fixed capacitors and the inductive elements are structured to produce a signal differential standing wave having a wavelength of $\lambda_S$ such that $\lambda_P$ is an integral multiple of $\lambda_S$.

According to a further aspect of the present invention, an amplifier circuit includes: an input module; an output module; a pump module; and a resonator portion. The resonator portion comprises a first transmission line and a second transmission line. The input module is electrically connected to the first transmission line and the second transmission line and is structured and/or connected to input an input signal to the first and second transmission lines. The first end of the first transmission line is directly electrically connected to the first end of the second transmission line at a first transmission line connection node. The pump module is structured, located, programmed and/or connected to pump alternating current electrical energy at a wavelength of $\lambda_P$ to the first and second transmission lines at the first transmission line connection node. The resonator portion is structured and/or connected to produce a pump standing wave with a wavelength of $\lambda_P$ and a signal differential standing wave having a wavelength of $\lambda_S$ such that $\lambda_P$ is an integral multiple of $\lambda_S$. The output module is electrically connected to the first transmission line and the second transmission line at a location where there is a zero crossing point in the pump standing wave signal. The output module is structured and/or connected to receive an output signal from the first and second transmission lines, with the output signal exhibiting noise squeezing.

BRIEF DESCRIPTION OF THE DRAWINGS

The present invention will be more fully understood and appreciated by reading the following Detailed Description in conjunction with the accompanying drawings, in which.

DETAILED DESCRIPTION OF THE INVENTION

I. Passive CMOS Frequency Divider Embodiments

To overcome these limits of conventional active, transistor-based frequency dividers (such as power consumption characteristics and channel noise), some embodiments of the present invention use parametric amplification in which the nonlinear interaction with a pump results in the signal gain by transferring the energy from the pump to the signal. Since this method does not use any active devices, low noise performance can be achieved. However, parametric amplification would tend to be regarded as requiring the use of high quality factor inductors and varactors for sufficient gain. For this reason, it is believed that parametric amplification has rarely, if ever, been implemented in CMOS technology. It is further believed that parametric amplification has rarely, if ever, been implemented "in a CMOS process" (as that term would be understood by those of skill in the relevant art). On the other hand, an oscillator only needs enough gain to compensate its resonator loss. This low gain requirement makes parametric oscillators capable of being implemented, in part, by a CMOS varactors. In some embodiments, the entire resonator circuit will be made "in a CMOS process." This kind of oscillation, sustained by the parametric amplification, is called parametric oscillation. The oscillation frequency in the parametric oscillator is synchronized to one of the sub-harmonics of the pump signal. This phenomenon can be exploited to make a frequency divider according to the present invention.

In the embodiment of the present invention to be explained below, the concept of parametric oscillation is used to design a passive 20 GHz CMOS frequency divider. In passive embodiments of the present invention, zero power consumption varactors may be used so that the resonator circuitry does not consume power. The frequency divider generally consists of two parallel nonlinear transmission lines using MOS-varactors, forming a reflective distributed resonator. This distributed structure enables a stable start-up condition and a broad range of frequency tunability. Moreover, the reflective resonator minimizes the number of components and forms a standing wave, which suppresses the pump signal at the output while maintaining a large output signal amplitude. In addition to zero static power consumption, the frequency divider to be discussed below exhibits better phase noise performance even at high offset frequencies because it does not have the channel noise from transistors as do conventional frequency dividers.

The theoretical underpinnings of distributed parametric amplification will now be discussed.

Figure 1:
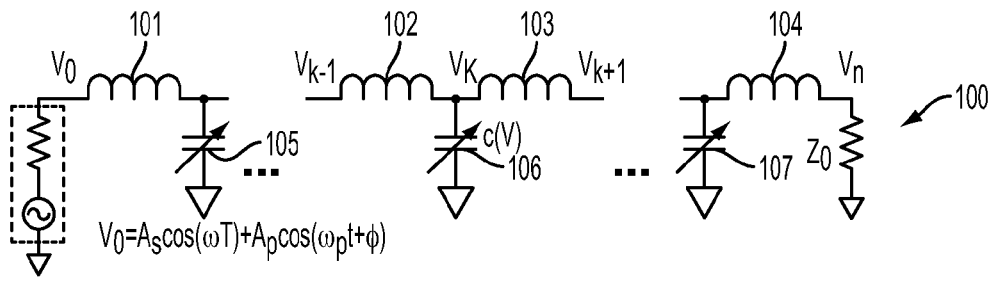
FIG. 1 is a schematic of a transmission line typical of those used in various embodiments of the present invention.

FIG. 1 shows a uniform artificial transmission line 100 consisting of inductors 101,102,103,104 and voltage-dependent (and hence nonlinear) capacitors 105,106,107. By applying KCL at node k, whose voltage with respect to ground is $V_k$, and applying KVL across the two inductors connected to this node, one can easily show the voltages of adjacent nodes on this transmission line are related via Equation 1 as follows:

$$l\frac{d}{dt}\left[c(V_k)\frac{dV_k}{dt}\right] = V_{k+1} - 2V_k + V_{k-1}$$

The nonlinear capacitor is approximated with a first-order function given by Equation (2) as follows: $c(V)=c_0(1+bV)$; where $c_0$ is the capacitance at zero bias and b is the C/V slope. For now, we neglect the loss of the transmission line. Equation (1) can be written as a partial differential Equation (3) by approximating the node voltage as a continuous variable over distance: $V_k=V(kh)\cong V(x)$. Here, h is the spacing between two adjacent nodes and k is the section number. We also introduce a unit length inductance, L=l/h, and a unit length capacitance, C=c/h. For simplicity, we assume that the dispersion effect caused by discreteness is negligible, due to a small h compared to the signal wavelength. Equation (3):

$$\frac{V_{k+1} - 2V_k + V_{k-1}}{h^2} = \left[\frac{(V_{k+1} - V_k)}{h} - \frac{(V_k - V_{k-1})}{h}\right]\frac{1}{h}$$

$$\cong \frac{\partial^2 V}{\partial x^2} = L\frac{\partial}{\partial t}\left[C(V)\frac{\partial V}{\partial t}\right]$$

Now, pump and signal are applied to the left end of the transmission line, and the pump frequency ($\omega p=2\omega$) is set to be twice the signal frequency ($\omega$). By inserting $V=V_s+V_p$ and Equation (2) into Equation (3), Equation (3) can be rewritten as Equation (4) as follows:

$$\frac{\partial^2 (V_s + V_p)}{\partial x^2} =$$

$$LC_0\frac{\partial^2 (V_s + V_p)}{\partial t^2} + LC_0 b\frac{\partial^2 (V_s \cdot V_p)}{\partial t^2} + \frac{LC_0 b}{2}\left[\frac{\partial^2 (V_s \cdot V_s)}{\partial t^2} + \frac{\partial^2 (V_p \cdot V_p)}{\partial t^2}\right]$$

where $V_s$ and $V_p$ are signal and pump voltages, respectively. The first term on the right corresponds to the linear wave propagation, and the second term represents the nonlinear coupling between pump and signal, which results in the parametric amplification. The third term on the right corresponds to the second-order harmonic generation (SHG) for signal and pump. We assume the signal amplitude is so small that the SHG for the signal is negligible, and that the SHG for the pump is sufficiently suppressed since the cut-off frequency of the transmission line is set to be lower than the second harmonic of the pump frequency. With these assumptions, we simplify into Equation (5) as follows:

$$\frac{\partial^2 (V_s + V_p)}{\partial x^2} = LC_0\frac{\partial^2 (V_s + V_p)}{\partial t^2} + LC_0 b\frac{\partial^2 (V_s \cdot V_p)}{\partial t^2}.$$

From coupled-mode theory, the signal is defined according to Equations (6), (7) and (7A) as follows:

$$V_s(x,t)=V(x)e^{j\omega t}+V^*(x)e^{-j\omega t} \qquad (6)$$

$$V_s(0,t)=A_s\cos(\omega t) \qquad (7)$$

$$V(x)=A(x)e^{-j\beta x}, V^*(x)=A^*(x)e^{j\beta x} \qquad (7A)$$

where β is the signal propagation constant. Here, the "*" notation denotes the complex conjugate. A(x) and A*(x) are slowly varying functions over x. In other words $\partial A/\partial x<<\beta A$. For a simple case, the pump is a sinusoidal function at a frequency of $\omega p=2\omega$. The initial phase difference between signal and pump is φ at x=0. Then, the pump can be characterized according to Equations (8) and (9) as follows:

$$V_p(x,t) = A_p\cos(\omega_p t - \beta_p x + \phi) \qquad (8)$$

$$= \frac{1}{2}A_p[e^{j(\omega_p t - \beta_p x + \phi)} + e^{-j(\omega_p t - \beta_p x + \phi)}] \qquad (9)$$

where $A_p$ is the amplitude of the pump and $\beta_p$ is the pump propagation constant. By substituting Equations (6) and (9) into Equation (5), and by approximating β as β≅squareroot$(LC_0)w\cong=\beta_p/2$ (small dispersion assumption), we derive the active coupled-mode equations for A(x) and A*(x) as Equations (10) and (11) as follows:

$$\frac{\partial A(x)}{\partial x} = -\frac{j\beta b A_p}{4}A^*(x)e^{j\phi} \qquad (10)$$

$$\frac{\partial A^*(x)}{\partial x} = \frac{j\beta b A_p}{4}A(x)e^{-j\phi}. \qquad (11)$$

Combining Equations (10) and (11), yields Equation (12) as follows:

$$\frac{\partial^2 A(x)}{\partial x^2} = \left(\frac{\beta b A_p}{4}\right)^2 A(x)$$

By applying the boundary condition of the signal expressed in Equation (7), and from Equations (10) and (12) the complete solution of Equation (12) is obtained as Equation (13) as follows:

$$V(x,t)=A_s[\cos\ hsx\cdot\cos(\omega t-\beta x)+\sin\ hsx\cdot\sin(\omega t-\beta x+\phi)]$$

where $s=\beta b A_p/4$. Depending on the initial phase difference between pump and signal, $\phi$, the signal can be exponentially growing or decaying over x as shown by Equation (14) as follows:

$$V(x,t) = \begin{cases} A_s e^{sx}\cos(\omega t - \beta x) & \text{for } \phi = \frac{\pi}{2} \\ A_s e^{-sx}\cos(\omega t - \beta x) & \text{for } \phi = -\frac{\pi}{2} \end{cases}$$

From Equation (14) and x=kh, the maximum parametric gain for the $k^{th}$ section is approximated by Equation (15) as follows:

$$G_k = \exp\left(\frac{bA_p\omega}{4}\sqrt{\left(\frac{l}{h}\right)\left(\frac{c_0}{h}\right)}\cdot kh\right) = \exp\left(\frac{bA_p\omega\sqrt{lc_0}}{4}\cdot k\right)$$

Figure 2:
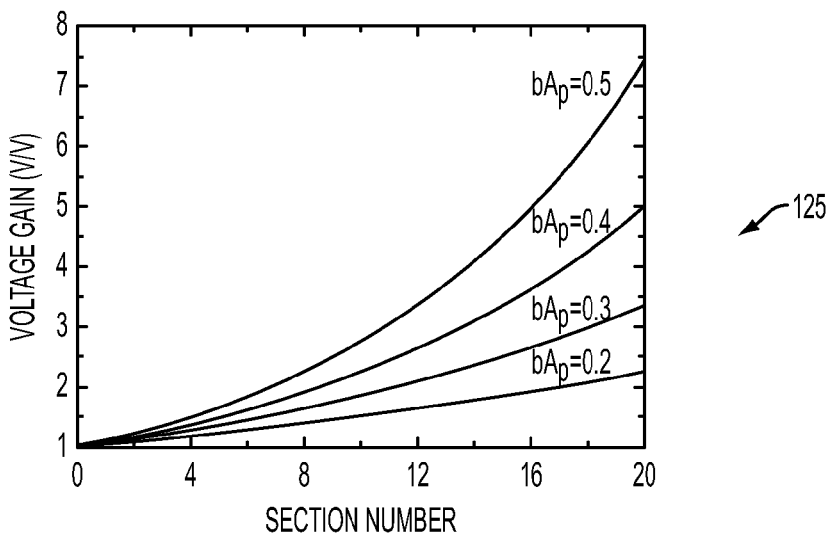
FIG. 2 is a graph showing information helpful in understanding the present invention.

Graph 125 of FIG. 2 shows the calculated gain based on Equation (15). The gain increases exponentially with the nonlinear factor, $bA_p$, as well as the section number. The nonlinear factor is defined by the multiplication of the varactor C/V slope, b, and the pump amplitude, $A_p$. Note that b is 0.5 $V^{-1}$ to 1.2 $V^{-1}$ for an accumulation-mode (NMOS) varactor in a typical 0.13 μm CMOS process. It is interesting that the gain grows exponentially in space while in a conventional distributed amplifier it increases linearly. This type of amplification process where the pump frequency is exactly twice the signal frequency is called degenerate parametric amplification. On the other hand, in embodiments where pump frequency is four times the signal frequency the amplification would be characterized as "non-degenerate parametric amplification."

In addition, Equation (15) shows that the gain increases with the inductance and the average capacitance at a given signal frequency. Intuitively, this is due to the fact that, in a transmission line with larger inductance and capacitance, the pump and the signal stay longer within each section, increasing the energy transfer. In other words, the effective propagation length is increased. However, the increase in the inductance and capacitance also leads to a decrease in the cut-off frequency defined by $w_c=2/\text{squareroot}(lc_0)$. The pump amplitude decreases as the cut-off frequency approaches the pump frequency. Therefore, the cut-off frequency of the transmission line should be optimized for maximum gain.

Figure 3:
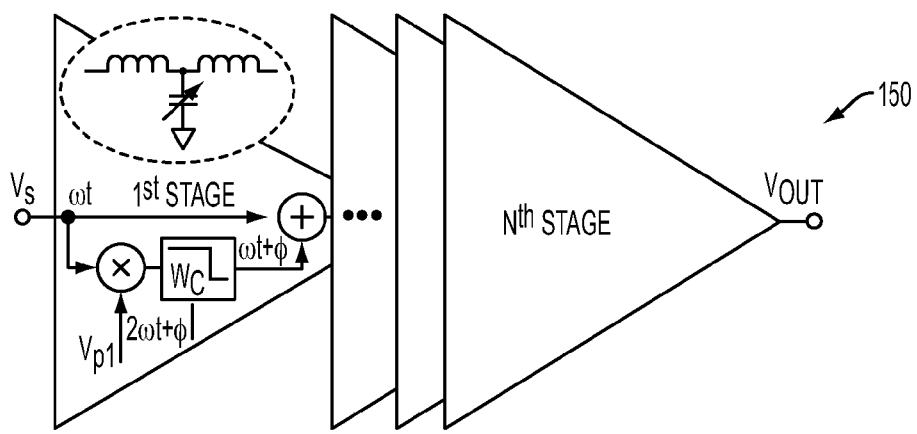
FIG. 3 is a schematic showing information helpful in understanding the present invention.

FIG. 3 illustrates the principle of distributed parametric amplification using a series of cascaded amplifiers. The nonlinear interaction of the signal ($\omega t$) and the pump ($2\omega t+\phi$) is shown using a mixer. This interaction generates two components at ($\omega t+\phi$) and ($3\omega t+\phi$). However, ($3\omega t+\phi$) is suppressed due to the cut-off frequency of the transmission line. Therefore, only ($\omega t+\phi$) remains, and it is added to the signal constructively or destructively depending on $\phi$. The resulting signal enters the next section, with an exponential amplification or attenuation (depending on the initial phase difference, $\phi$). The main advantage of parametric amplification is that it reduces or eliminates the need for any active devices, which gives it the potential for much lower noise figure than conventional transistor-based amplifiers. So far, we assumed that there is no dispersion in the transmission line in order to simplify the analysis. The pump propagation constant, $\beta_P$, was set to be exactly twice the signal propagation constant, $\beta$. In other words, the signal and the pump were assumed to co-propagate at the same velocity, or be synchronized for maximum energy transfer from the pump to the signal. However, in a transmission line that has a cut-off frequency comparable with the pump frequency for an optimized gain, the dispersion is not negligible. In this case, the deviation from $\beta_P=2\beta$ results in a gain drop. It can be shown that, with the phase mismatch of $\Delta\beta=\beta P-2\beta$, the exponential coefficient is given by Equation (16) as follows:

$$s = \sqrt{\left(\frac{\beta b A_p}{4}\right)^2 - \left(\frac{\Delta\beta}{2}\right)^2}. \tag{16}$$

From Equation (16), we can see that parametric amplification does not occur when $\Delta\beta/\beta$ is larger than $bA_p/2$. Inserting the typical values for $b=0.5\ V^{-1}$ and $A_P=0.5\ V$, the allowable $\Delta\beta/\beta$ is 12.5% for a non-zero parametric gain. Considering the transmission line loss caused by a limited quality factor of each element, the range becomes even narrower. Another important point is that a small phase mismatch between signal and pump is accumulated as the signal propagates over multiple sections. If the accumulated phase mismatch reaches $\pi$, further propagation gives attenuation instead of amplification (see the expression of V(x, t) in Equation (14) and note that the difference of $\phi$ between amplification and attenuation is $\pi$).

Figure 4A:
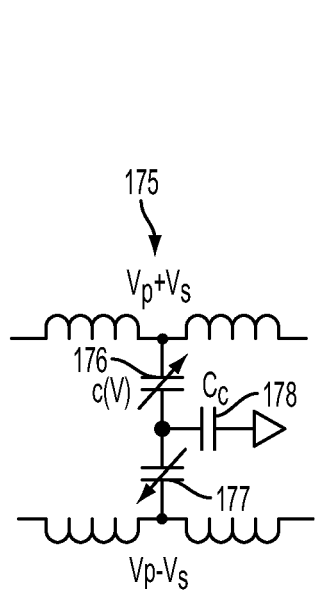
FIGS. 4A, 4B and 4C are schematic views of circuitry helpful in understanding the present invention.
Figure 4B:
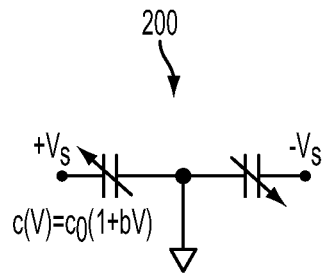
Figure 4C:
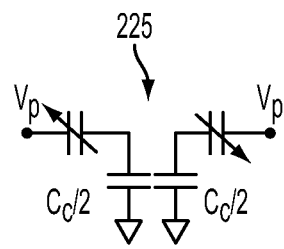
Figure 5:
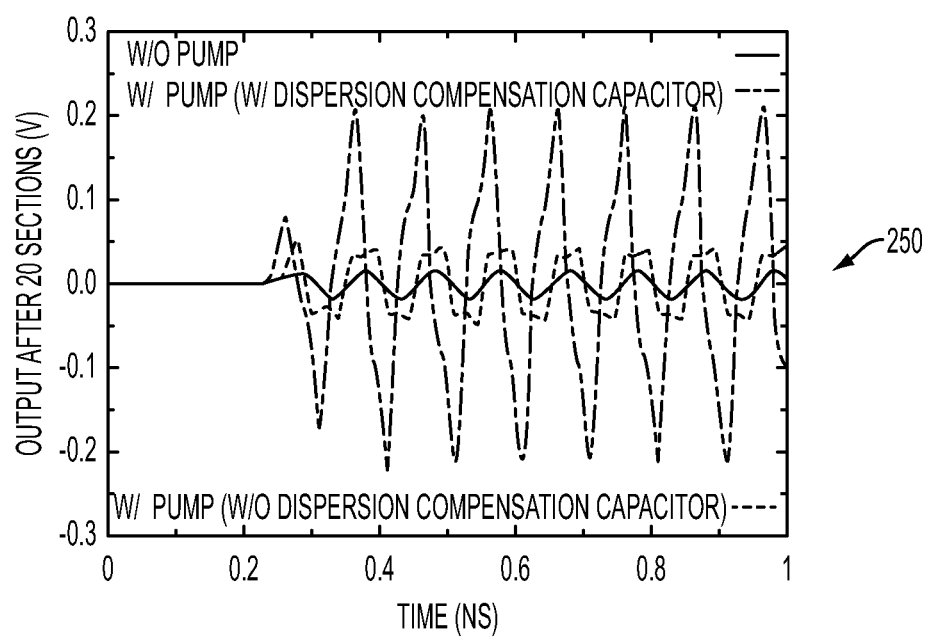
FIG. 5 is a graph showing information helpful in understanding the present invention.

We propose a simple solution based on two parallel nonlinear transmission lines with "dispersion compensation capacitors" as shown in FIGS. 4A, 4B and 4C. FIG. 4A shows resonator circuit portion 175 according to the present invention including first variable capacitor 176, second variable capacitor 177 and first linear capacitor 178. FIG. 4B shows schematic 200 that shows for signal: differential mode. FIG. 4B shows schematic 225 that shows for pump: common mode. FIGS. 4A, 4B and 4C show proposed phase matched line: $C_C$ compensates the decrease in pump propagation velocity due to dispersion. In this scheme, the signal is applied differentially to two parallel lines while the pump is a common-mode signal. For differential signals, the net average capacitance is $C_0$ due to the virtual ground. However, the net average capacitance for the pump drops to $C_0$ in series with ($C_C/2$) due to the dispersion compensation capacitor. This decreases the pump propagation delay without changing the signal propagation, canceling the dispersion of the nonlinear transmission line. Graph 250 of FIG. 5 shows the effect of proposed phase matching on parametric amplification using Spectre in Cadence. Graph 250 shows the effect of dispersion compensation capacitor, $C_C$, for phase matching ($\omega$=10 GHz, n=20, l=630 picohenry (pH), $c_0$=250 fF, $C_C$=1.2 picofarads (pF)).

Figure 6A:
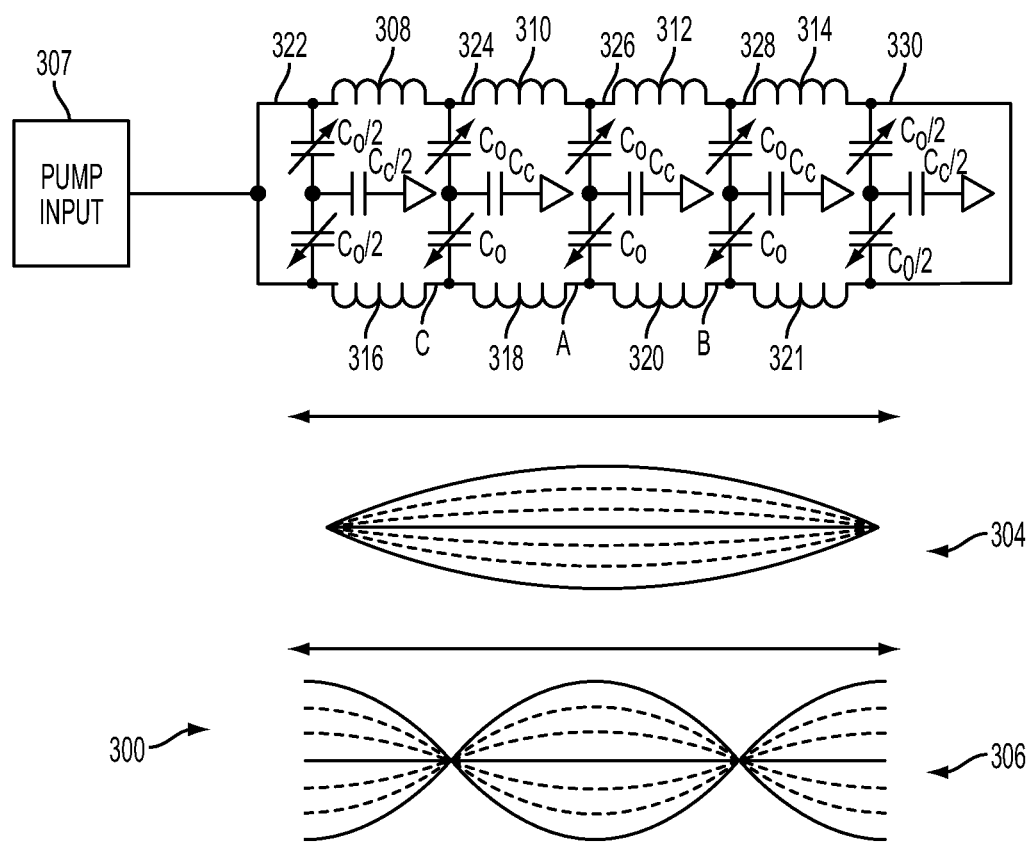
FIGS. 6A, 6B and 6C are each a schematic view of, respectively, a first, second and third embodiment of a resonator circuit according to the present invention.
Figure 6B:
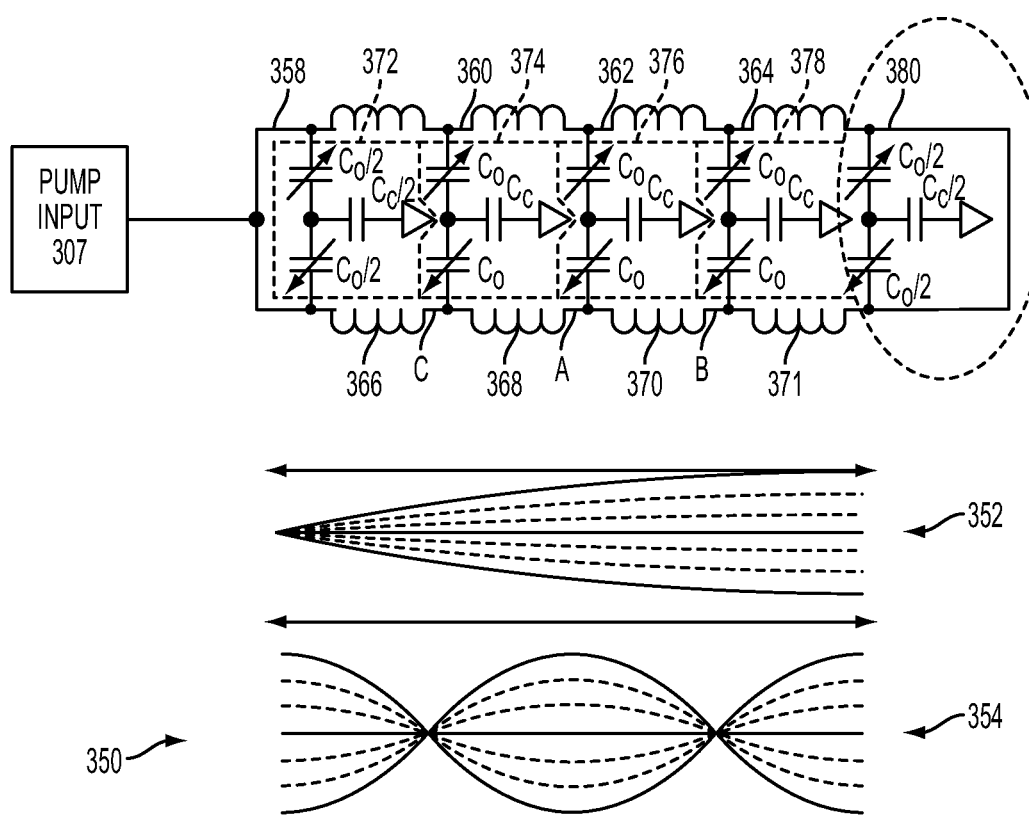
Figure 6C:
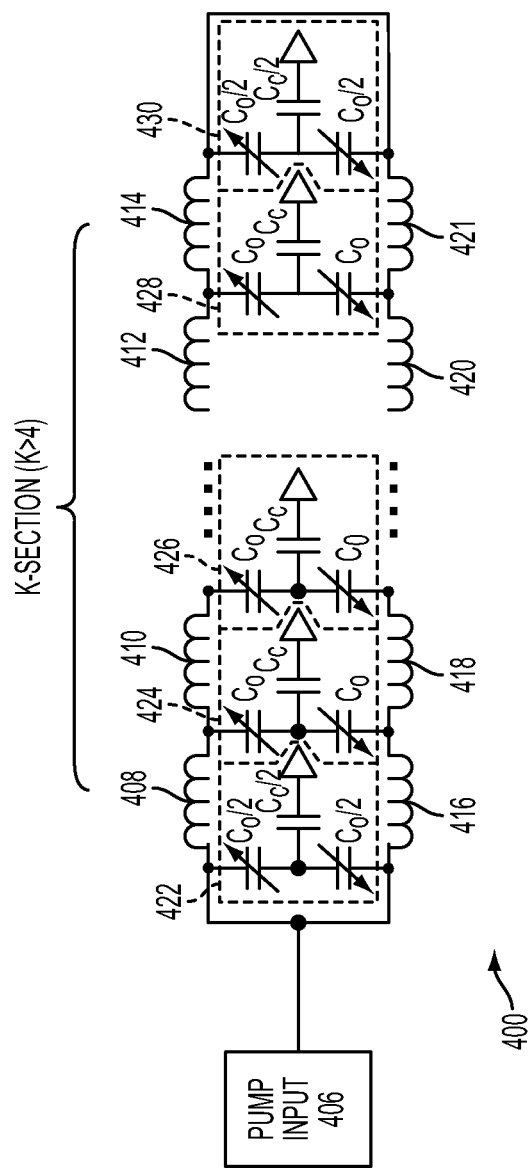

Embodiments of standing wave parametric oscillators which can be used as a frequency dividers will now be discussed with reference to FIGS. 6A, 6B and 6C. FIG. 6A shows a divide-by-two distributed resonator with two reflective ends. Resonator 300 includes: standing wave formation for the signal 304; standing wave formation for the pump 306; pump input 307; inductors 308,310,312,314,316,318,320,321; first capacitor sub-module 322; second capacitor sub-module 324; third capacitor sub-module 326; fourth capacitor sub-module 328; and fifth capacitor sub-module 330. FIG. 6B shows a divide-by-four distributed resonator with two reflective ends. Resonator 350 includes: standing wave formation for the signal 352; standing wave formation for the pump 354; pump input 356; inductors 358,360,362,364,366,368,370,371; first capacitor sub-module 372; second capacitor sub-module 374; third capacitor sub-module 376; fourth capacitor sub-module 378; and fifth capacitor sub-module 380. FIG. 6C shows a divide-by-N distributed resonator with two reflective ends. Resonator 400 includes: pump input 406; inductors 408,410,412, 414,416,418,420,421; first capacitor sub-module 422; second capacitor sub-module 424; third capacitor sub-module 426; fourth capacitor sub-module 428; and fifth capacitor sub-module 430. As indicated by ellipsis, circuit 400 may include additional inductor-capacitor modules.

Parametric oscillation occurs when the parametric amplification compensates the loss of a resonator at the resonance frequency. Here, we use this concept to demonstrate a frequency divider by considering the pump as the input signal. FIG. 6A shows the structure of the proposed parametric oscillator. It consists of two transmission lines with four phase-matched LC sections that are tied at both ends. When the pump is strong enough to compensate the loss, the thermal noise on the transmission line grows through the degenerate parametric amplification by traveling back and forth between two reflective ends. The signal amplitude will increase up to the point where the gain and the loss are equal due to the gain saturation. The gain saturation occurs from the drop in the pump level caused by the large energy flow to the signal, which is called pump depletion. In order to calculate the steady-state output amplitude, we start with the coupled-mode Equations (10) and (11), above, for $\phi=\pi/2$. After adding the transmission line loss and the pump depletion in these equations, the coupled-mode equations can be modified to the following Equations (17) to (19) as follows:

$$\frac{\partial A}{\partial x} = -\alpha_s A + \frac{\beta b A_p}{4} A^* \quad (17)$$

$$\frac{\partial A^*}{\partial x} = -\alpha_s A^* + \frac{\beta b A_p^*}{4} A \quad (18)$$

$$\frac{\partial A_p}{\partial x} = -\alpha_p A_p - \beta b |A|^2 + \kappa A_{pin} \quad (19)$$

where: $\alpha_S$ and $\alpha_P$ are the attenuation constants of the transmission line at signal and pump frequencies, respectively; $A_{PIN}$ is the input amplitude into each transmission line of the resonator. $\kappa A_{PIN}$ represents the effective pump signal level inside the resonator. In Equation (19), the second term on the right corresponds to the pump depletion. This term can be easily obtained by adding the second harmonic generation of the signal in Equations (4) to (5). Equations (21) to (29) will now be set forth and then be discussed:

$$A_p|_{steady} = \frac{4\alpha_s}{\beta b} \quad (20)$$

$$A_{pin}|_{th} = \frac{\alpha_p}{\kappa} A_p|_{steady} \quad (21)$$

$$|A|^2_{steady} = \frac{1}{\beta b}(\kappa A_{pin} - \alpha_p A_p|_{steady}) \quad (22)$$

$$= \frac{\kappa A_{pin}|_{th}}{\beta b}\left(\frac{A_{pin}}{A_{pin}|_{th}} - 1\right) \quad (23)$$

$$= \frac{\kappa^2}{4\alpha_s \alpha_p} A_{pin}|_{th}^2 \left(\frac{A_{pin}}{A_{pin}|_{th}} - 1\right) \quad (24)$$

$$A_{p_{m+1}} = A_{p_m} \exp(-2\alpha_p d) + A_{pin} \quad (25)$$

$$A_{pin}|_{th} = A_p|_{steady}(1 - \exp(-2\alpha_p d)). \quad (26)$$

$$\kappa = \frac{\alpha_p}{(1 - \exp(-2\alpha_p d))}. \quad (27)$$

$$|A|_{steady} = \frac{A_{pin}|_{th}}{2(1 - \exp(-2\alpha_p d))}\sqrt{\frac{\alpha_p}{\alpha_s}}\sqrt{\frac{A_{pin}}{A_{pin}|_{th}} - 1} \quad (28)$$

$$A_{pin}|_{th} = \frac{4\alpha_s(1 - \exp(-2\alpha_p d))}{\beta b} = \frac{2(1 - \exp(-2\alpha_p d))}{Qb}. \quad (29)$$

For the steady state solution where gain and loss are equal, so that the signal amplitude is constant over the propagation, $\partial A/\partial x$, $\partial A^*/\partial x$, $\partial A_p/\partial x$ are set to be zero. In this case, combining Equations (17) and (18) results in Equation (20). At the oscillation threshold where $A=A^*=0$, Equation (19) gives a threshold input pump amplitude as set forth in Equation (21). By substituting Equations (20) and (21) into (19), Equation (19) can be rearranged as set forth in Equations (22) to (24). At the resonator end where the pump is injected, the relation between mth and (m+1)th round-tripped pump amplitudes, given by Equation (25). In Equation (25) 2d is the round-trip length of the resonator. The pump amplitude is assumed to be below the threshold. In the steady state, Equation (25) becomes Equation (26). Combining Equations (21) and (26), K is reduced to Equation (27). From Equations (24) and (27), the steady state amplitude of the output signal can be characterized by Equations (28) and (29).

Note that $|A|_{steady}$ is a steady-state amplitude of a traveling wave propagating back and forth between two reflective ends, and that the voltage we measure at output node is the superposition of forward and backward waves with an amplitude of $|A|_{steady}$, thereby forming a standing wave. Therefore, the output voltage measured at $x_{out}$ is $\lambda|A|_{steady}$ where $\lambda=2|\sin(\beta x_{out})|$ for a resonator length of $d=\lambda_s/2$.

So far, we assumed that pump is perfectly reflected back at the end of the resonator. In other words, the reflection coefficient was assumed to be one for both open ends. However, we connect the external signal source at one end of the resonator to supply a pump, and the source has a finite output impedance, which is usually 50 ohms ($\Omega$). This finite output impedance makes a reflection coefficient not to be one, thereby resulting in additional loss of energy from the pump. Therefore, we need to come up with an effective pump loss, $\alpha_{PE}$, to replace $\alpha_P$ which solely comes from the transmission line loss. The pump round-trip loss including the additional loss at imperfect reflection can be expressed by Equations (30) and (31):

$$\exp(-2\alpha_{pe}d) = \Gamma\exp(-2\alpha_p d) \quad (30)$$

$$\alpha_{pe} = \alpha_p - \frac{\ln\Gamma}{2d} \quad (31)$$

where $\Gamma$ is a reflection coefficient at the end of the resonator connected with an external signal source.

Figure 7A:
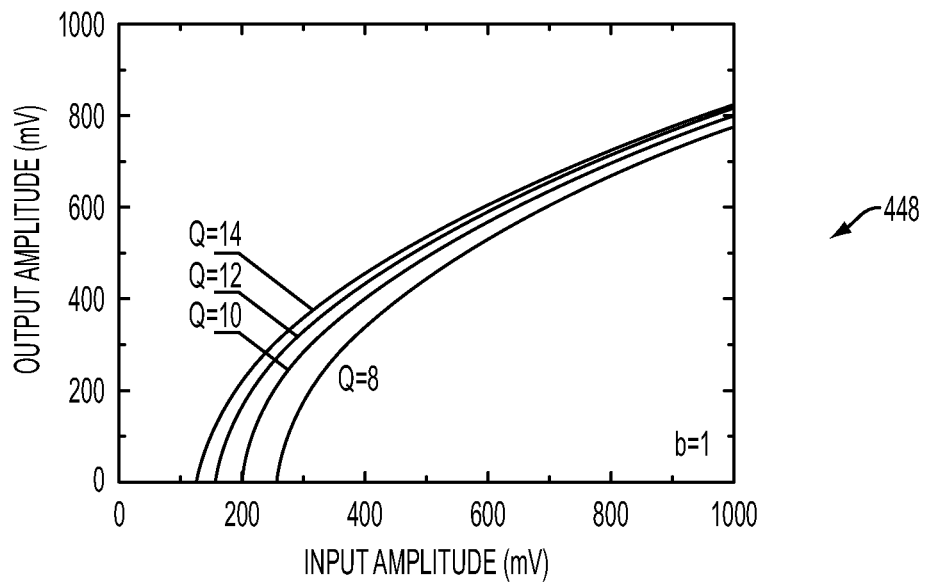
FIGS. 7A and 7B are graphs showing information helpful in understanding the present invention.
Figure 7B:
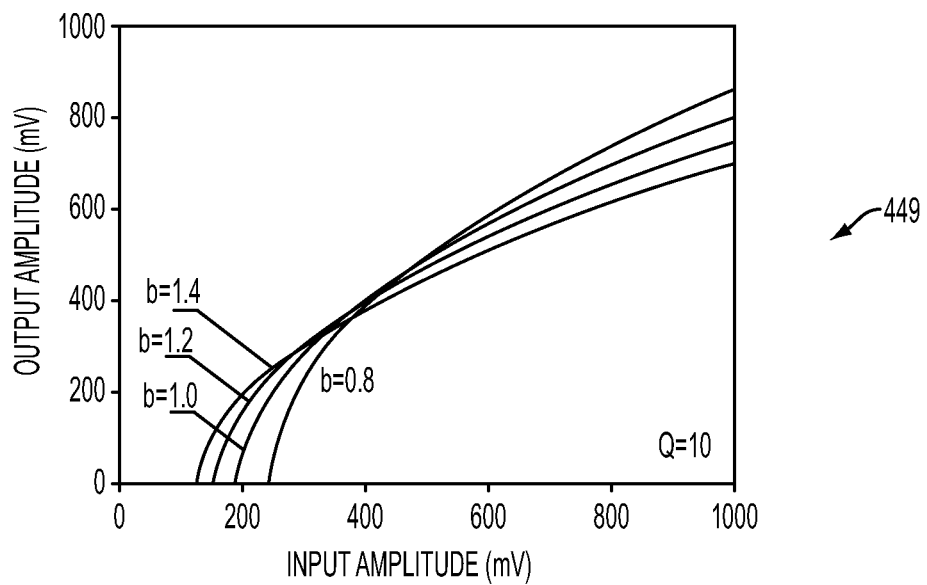

Graphs 448 and 449 of FIGS. 7A and 7B shows the calculated output amplitude versus the input amplitude based on Equations (28) and (31). To investigate the effect of the loss and the nonlinearity, we change the quality factor of the transmission line and varactor C/V slope, b. As expected from Equation (29), the oscillation threshold decreases as the resonator loss decreases and the nonlinearity of the varactor increases. However, the slope of the output amplitude versus input amplitude varies in a different way: while lower loss still gives higher slope, the high nonlinearity results in lower slope due to the higher pump depletion. In a real system, additional losses from vias and interconnects decrease the effective quality factor of the line, and the parasitic capacitance around transmission lines decreases the nonlinearity. These non-ideal effects require careful attention to layout.

The lower part of FIG. 6A shows different standing wave formations inside the resonator for pump and signal. The differential signal sees the resonator ends as shorts due to the virtual ground, while the common-mode pump sees the ends as open nodes. With the reflection at both ends, the signal forms a $\lambda_S/2$ standing wave with minimum amplitudes at both ends. On the other hand, the pump forms a $\lambda_p$ standing wave with maximum amplitudes at both ends. The higher modes for pump and signal are suppressed by the cut-off frequency of the resonator.

The oscillation frequency is determined by the standing wave formula given in Equation (32) as follows:

$$d = nh = \frac{\lambda_s}{2} = \frac{\pi}{\beta} = \frac{1}{2f_{osc}\sqrt{(l/h)(c_0/h)}} \quad (32)$$

where d is the physical length of the transmission line, h is the spacing between two adjacent nodes, and n is the number of sections of the resonator. The varactor capacitance per unit section is approximated by its average value, $c_0$. Equation (32) can be rearranged to Equation (33) as follows:

$$f_{osc} = \frac{1}{2n\sqrt{lc_0}}. \quad (33)$$

The loop gain at a given oscillation frequency in a resonator with n sections is roughly given by Equation (34):

$$G_{loop} = \exp\left(\frac{bA_p\omega_{osc}\sqrt{lc_0}}{4}\cdot 2n\right) = \exp\left(\frac{\pi bA_p}{2}\right). \quad (34)$$

This equation shows that the loop gain at a fixed oscillation frequency does not depend on the number of sections. In frequency dividers 300 (see FIG. 6A) and 350 (see FIG. 6B), we set n to be four (4) for a small footprint and reasonable attenuation especially for the pump signal. Another reason for having four sections is that we can exploit the different standing wave formations for pump and signal to suppress the pump frequency at the output. Alternatively n may be set to other numbers of capacitor-inductor modules. A note on the terminology will now be given A note on the terminology will now be given. A capacitor-inductor module shall include a capacitor sub-module and the two inductive elements "behind" it, respectively disposed on each transmission line. By "behind" it is meant that the inductive element is on the side of the capacitor sub-module opposite the pump side. The transmission lines of the capacitor-inductor module: (i) may include more than one inductor (of any type now known or to be developed in the future); (ii) may include additional circuit elements (although this is not necessarily currently preferred); and/or (iii) may each include multiple sub-lines run in parallel (although this is not necessarily currently preferred). The capacitor sub-module will include at least one variable capacitor. As shown in FIGS. 6A, 6B and 6C, in embodiments 300, 350 and 400, the capacitor sub-modules include two equal value variable capacitors connected in series with a fixed capacitor shunt to ground connected at a node between the two variable capacitors. Herein, this specific type of capacitor sub-module will be referred to as "symmetric grounded capacitor sub-module." As further shown in FIGS. 6A, 6B and 6C, it is further noted that circuits according to the present invention may include capacitor sub-modules that are not part of a capacitor-inductor module because they include no associated inductive elements on the transmission lines (see FIGS. 6A to 6C at reference numerals 330, 380 and 430).

There are three possible nodes for taking the signal out of the resonator as shown by nodes A,B,C in FIG. 6A. Node A provides the maximum amplitude for both pump and signal, and the pump signal will be filtered out only if the output signal is taken differentially from the two transmission lines. However, we need an extra low-pass filter for a single-ended output at "A." On the other hand, nodes B or C can suppress the pump even for the single-ended output thanks to the standing-wave formation. The downside is a lower signal amplitude compared to node A, node B is more appropriate for the suppression of the pump than node C, because the amplitude imbalance between forward and backward waves due to the loss is smaller in this node. In addition, the external connection for the output adds a parasitic conductance to the resonator, resulting in extra loss. The power dissipation caused by the additional conductance is $P_{DISS}=\frac{1}{2}G(V_P)^2$, which is proportional to the square of the pump amplitude. Therefore, connecting the output port at node A leads to the maximum loss in the pump amplitude, and it raises the threshold voltage and decreases the amplitude of the signal.

Figure 8:
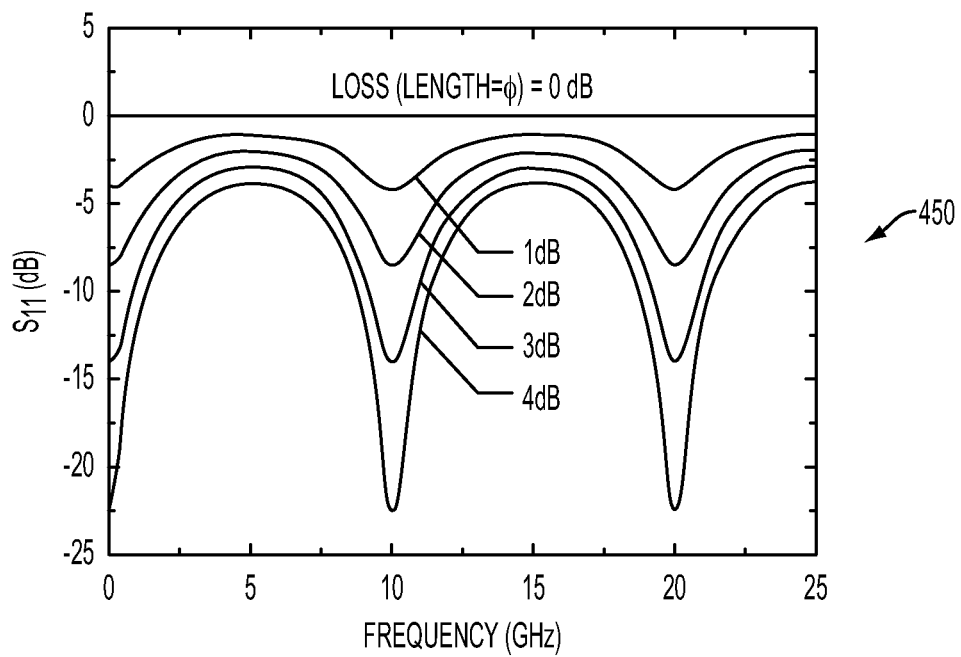
FIG. 8 is a graph showing information helpful in understanding the present invention.

The remaining challenge is to inject pump power into the resonator effectively. For pump, the resonator is simply two parallel open-ended transmission lines with a length of Ap. The input impedance looking into one end of the resonator is given by Equations (35) and (36) as follows:

$$Z_{in} = \frac{Z_0}{2}\frac{1}{\tanh(\alpha + j\beta_p)\lambda_p} \quad (35)$$

$$\simeq \frac{Z_0}{2}\left[\frac{\alpha\lambda_p - j\cos(\beta_p\lambda_p)\sin(\beta_p\lambda_p)}{(\alpha\lambda_p\cos(\beta_p\lambda_p))^2 + \sin^2(\beta_p\lambda_p)}\right] \quad (36)$$

where $Z_0$ is the characteristic impedance of each transmission line. The input impedance becomes purely real at the resonance frequency and its harmonics. By selecting the right value for the characteristic impedance for a given a and $A_P$, one can achieve the input matching without an additional matching network. Graph 450 of FIG. 8 shows the calculated input matching for different values of loss of the transmission line. More specifically, graph 475 shows input matching of the frequency divider for different values of loss of transmission line with a length of We assume that the input impedance and the characteristic impedance of each transmission line are 50Ω. As the loss increases, the real part of the input impedance approaches 50Ω, making a better matching. Considering that the loss of the transmission line in our designed resonator is around 3 dB at the pump frequency in 0.13 μm IBM CMOS process, embodiments 300, 350 and 400 are believed to have a good input match. (Note: the term(s) "IBM" may be subject to trademark rights in various jurisdictions throughout the world and is used here only in reference to the products or services properly denominated by the marks to the extent that such trademark rights may exist.)

Now some comments on phase noise performance will be discussed. One of the main advantages of our design is a better phase noise performance than the conventional injection-locked frequency dividers. In an LC oscillator where transistors are used for sustaining oscillation, the channel noise makes the main contribution to the phase noise. Although the phase noise of the injection-locked frequency divider follows that of the injected signal within a narrow locking range, it might be easily degraded back to the level of a free-running LC oscillator due to the frequency mismatch between injected signal and LC resonator. Some embodiments of the present invention do not have any transistors, which omission can help achieve a low phase noise floor.

Another interesting point is that our frequency divider has high spectral purity because of its phase selection property as shown in Equation (14). Start-up noise such as a thermal noise grows by the degenerate parametric amplification for a pump power over the threshold. The degenerate parametric amplification picks a limited noise component to be amplified in terms of phase and frequency. This is because the degenerate parametric amplification works only for $\omega=\omega_P/2$ and a specific initial phase difference between $2\omega$ and $\omega_P$ as we discussed above.

Figure 9:
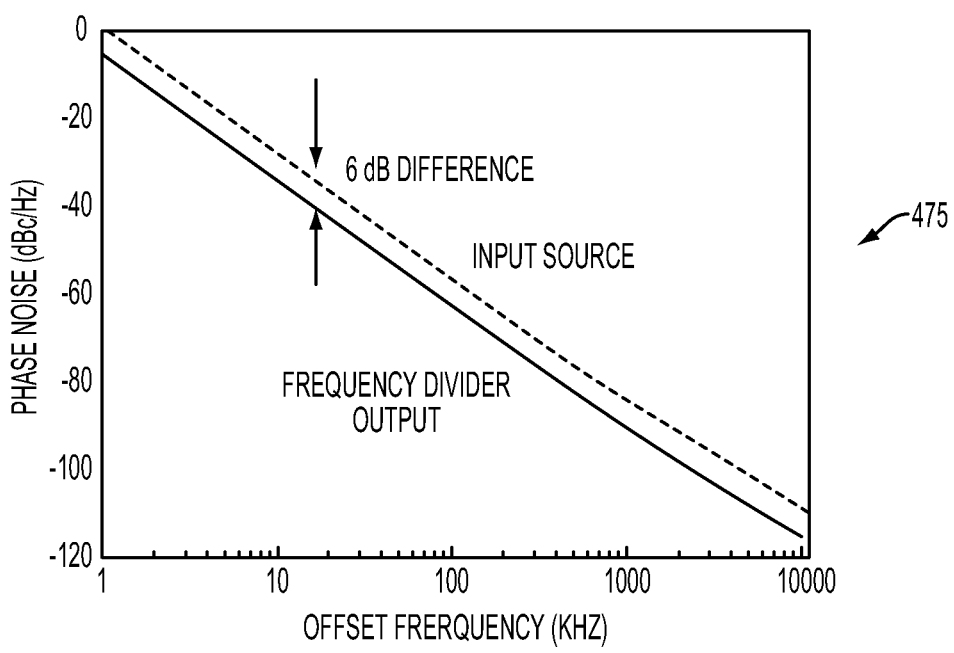
FIG. 9 is a graph showing information helpful in understanding the present invention.

The noise component at $\omega=\omega_P/2+\Delta\omega$) can also be amplified by nondegenerate parametric amplification, which is the more general case for $\omega P \neq 2\omega$. However, the gain from the nondegenerate parametric amplification is much lower than the degenerate parametric gain, and the noise component at $\omega=\omega_P/2$ grows faster than other spectral components. As a result, most of the pump power is transferred to $\omega=\omega_P/2$ and the nondegenerate amplification is suppressed. Graph 475 of FIG. 9 shows the simulated phase noise performance at 20 GHz using Spectre in a 0.13 μm CMOS process. The phase noise difference between input and output is 6 dB over simulation frequencies, which agrees with an ideal value, 20 $\log_{10}N$ dB, for a divide-by-N frequency divider.

Figure 10:
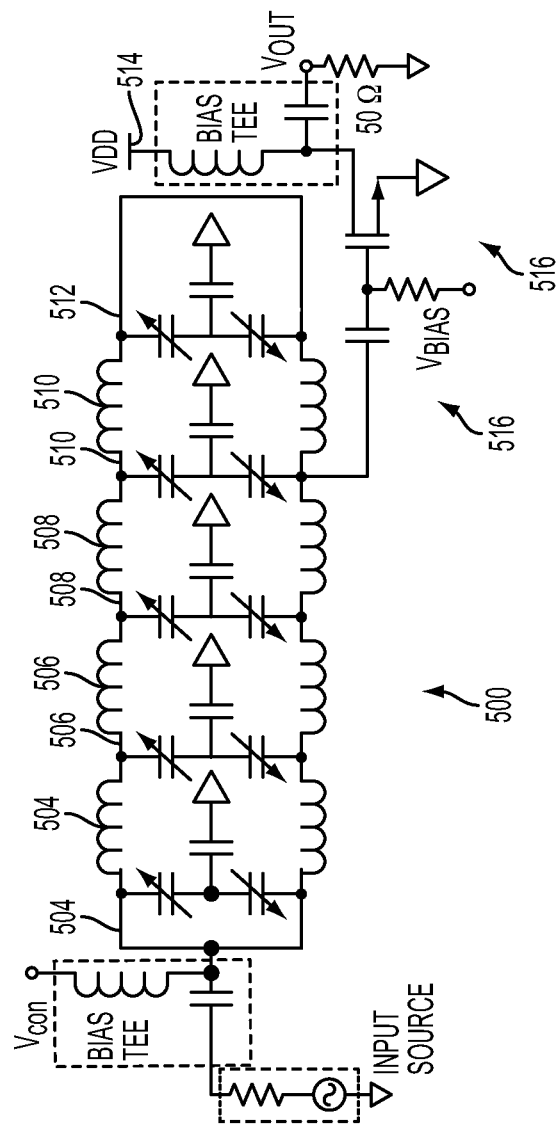
FIG. 10 is a schematic view of a fourth embodiment of a resonator circuit according to the present invention.

Some design and measurement issues will now be discussed. FIG. 10 shows frequency divider 500 including: pump module 502; capacitor-inductor modules 504,506,508, 510; loop-end capacitor sub-module 512; output terminal 514; and output module 516.

We design a 20 GHz frequency divider based on the parametric oscillator in a 0.13 μm CMOS process. First, we set the cut-off frequency of the resonator for maximum gain as discussed above. In our design, it is this optimum value (25 GHz in this particular example) that determines the product of the inductance and capacitance. The number of sections is set to four, in the examples of embodiments 300 and 350, as discussed above. These values for the section number (that is, the number of complete capacitor-inductor modules) and the cut-off frequency lead to a resonant frequency of 10 GHz. Then, the dispersion compensation capacitor is determined by phase-matching condition between the pump and the signal. The phase matching can be verified by making sure that the resonance frequency of $S_{11}$ is exactly at 20 GHz. $S_{11}$ is an s-parameter that represents the reflection of input power from the circuits. Less reflection means better input power matching. Without the dispersion compensation, $S_{11}$ has a resonance frequency lower than 20 GHz. Finally, depending on the magnitude of the input matching, the characteristic impedance can be selected which gives the ratio of inductance and capacitance. A buffer is added to the output module as shown in FIG. 10. Note that the buffer is only needed for testing purposes using a 50Ω load. There are two output ports, which give us the option to have single-ended or differential outputs. The oscillation frequency can be tuned by controlling the voltage $V_{CON}$ through the bias tee of pump (or input) module 502.

Figure 11:
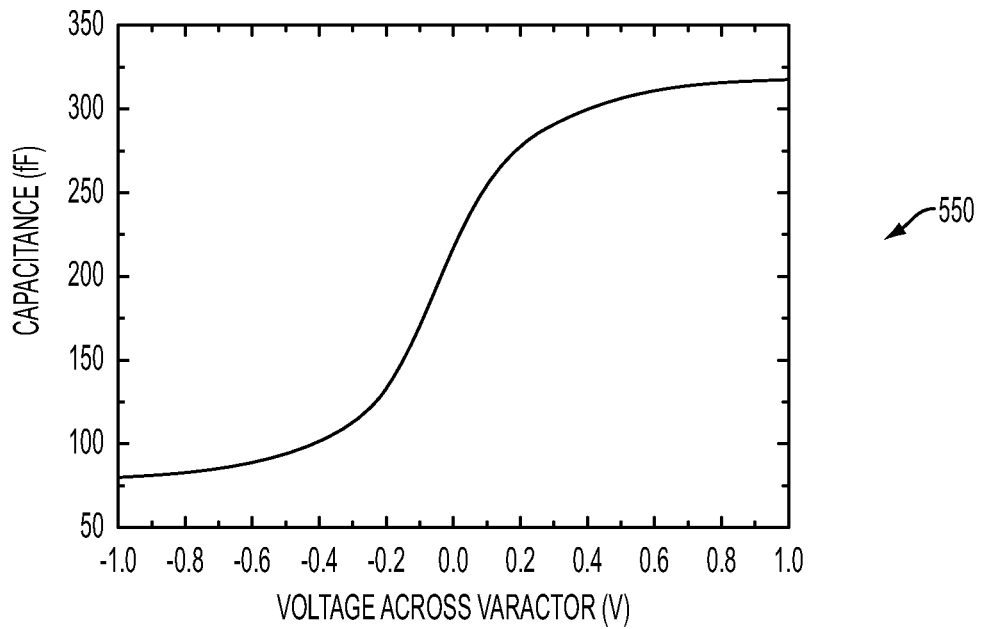
FIG. 11 is a graph showing information helpful in understanding the present invention.

Circuit 500 uses ground-shielded spiral inductors with quality factors of around 20 at 20 GHz. Accumulation-mode NMOS varactors are used as voltage-dependent capacitors. The capacitance versus voltage of these capacitors is shown in graph 550 of FIG. 11. The ratio of maximum-to-minimum capacitances is around 3.5, which represents the nonlinearity of the system. The varactors of circuit 500 use a multi-finger gate structure to optimize the nonlinearity and the quality factor simultaneously. For dispersion compensation capacitors, vertical natural capacitors (VNCAP) may be used due to their high quality factor.

Figure 12:
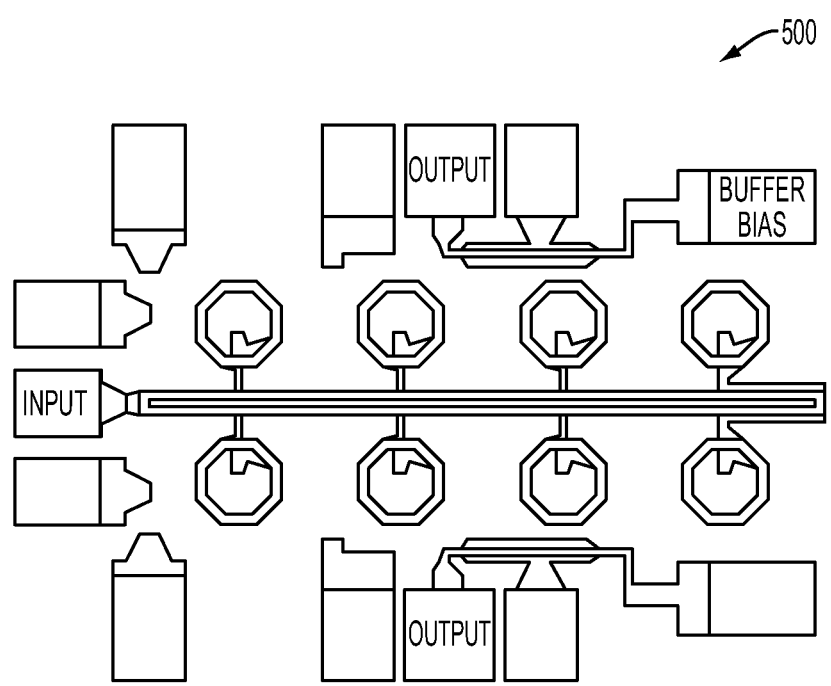
FIG. 12 is an orthographic top view of the fourth embodiment resonator.

FIG. 12 shows the chip photograph of circuit 500 implemented in a 0.13 μm CMOS process. The core area of the die is 0.75×0.32 mm², not including pads. As the design frequency increases, the sizes of the inductors are scaled down and the whole structure can be made of two parallel transmission lines without the spiral inductors shown in the photograph of FIG. 12. In other words, this frequency divider can easily fit in the entire system layout with great flexibility.

Frequency dividers according to the present invention may be measured using an Agilent E8257D signal generator for the pump signal and an Agilent 8564EC spectrum analyzer. To measure the input matching, an Agilent E8364B network analyzer is used. We deemed the loss of all cables, adapters, bias tees, and probes for a more accurate measurement. The bias current for the buffer is set to be 8 mA from a 1.2 V power supply. (Note: the term(s) "Agilent E8257D," "Agilent 8564EC," and/or "Agilent E8364B network" may be subject to trademark rights in various jurisdictions throughout the world and are used here only in reference to the products or services properly denominated by the marks to the extent that such trademark rights may exist.)

Figure 13:
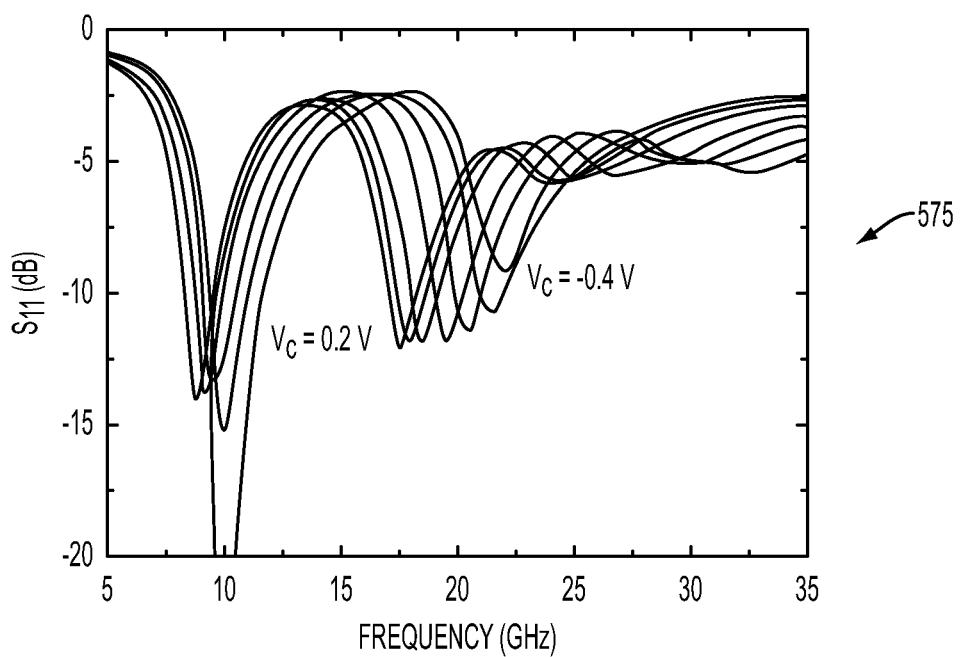
FIG. 13 is a graph showing information helpful in understanding the present invention.

$S_{11}$ is measured to investigate the input matching while changing the control voltage. As shown in graph 575 of FIG. 13, frequency divider 500 has a reasonable matching performance of $S_{11}$<-10 dB over 18 GHz to 22.5 GHz.

The article "Distributed Parametric Resonator: A Passive CMOS Frequency Divider," IEEE Journal of Solid-State Circuits, Issue Date: September 2010, Volume: 45, Issue:9 On page(s): 1834-1844, ISSN: 0018-9200, INSPEC Accession Number: 11487077, Digital Object Identifier: 10.1109/JSSC.2010.2056833, Date of Current Version: 23 Aug. 2010, by the inventors of the present application and herein incorporated by reference in its entirety describes and graphs outputs achievable with circuit 500. To summarize, circuit 500 works well as a resonator, works well as a frequency divider and works well as part of a phase lock loop (PLL) circuit.

II. Parametric Resonant Amplifier Embodiments

Further information about this portion of the disclosure is provided in the article "Low-Noise Parametric Resonant Amplifier," by Wooram Lee and Afshari, E., Sch. of Electr. &

Comput. Eng., Cornell Univ., Ithaca, N.Y., USA, this paper appears in: IEEE Transactions on Circuits and Systems I: Regular Papers, Issue Date: March 2011, Volume: 58, Issue: 3, On page(s): 479-492, ISSN: 1549-8328, INSPEC Accession Number: 11835868, Digital Object Identifier: 10.1109/TCSI.2010.2072370, Date of Publication: 2010 Nov. 11 15:16:15.0, Date of Current Version: 22 Feb. 2011. This article is hereby incorporated by reference in its entirety. This article will hereinafter be referred to as the Inventors' Amplifier Article.

According to an aspect of the present invention, a resonant parametric amplifier in which the gain comes from the non-linear interaction between signal and pump for a negative NF (dB). Basically, the amplifier of the present invention can provide phase-sensitive gain. One of the quadrature input noise components (out-of-phase) is suppressed when the input noise consists of two quadrature components: in-phase and out-of-phase relative to the pump signal. This noise squeezing reduces input noise by almost 3 dB at the output compared to the phase-insensitive amplifier for a fixed signal gain. When an input signal is placed only in the direction of in-phase and obtains the whole gain, a negative NF can be achieved due to a 3-dB reduction in output noise.

It is believed that the present invention is the first demonstration of the noise squeezing to minimize NF in a low-noise amplifier in a CMOS process. The design of the proposed amplifier can amplify a narrow-band signal and overcome the limitation of a single-pass parametric amplifier structure.

Distributed parametric amplification using a non-linear transmission line will now be discussed. This portion of the discussion will review the basic theory behind the parametric amplification using a nonlinear transmission line. Assume a uniform artificial differential transmission line consisting of inductors and voltage-dependent (and hence non-linear) capacitors, as shown in FIG. 1. FIG. 1 shows a capacitor-inductor portion 601 of an amplifier circuit according to the present invention. Portion 601 includes: nodes T1, T2, T3 and T4; waveforms 604,606,608,610,612,614; first capacitor-inductor module 620; second capacitor-inductor module 622; third capacitor-inductor module 624; and capacitor sub-module 626.

The nonlinear capacitors of portion 601 are approximated with a first-order function given by equation (37) as follows:

$$C(V)=C_0(1+bV)$$

where $C_0$ is the capacitance at zero bias and b is the C/V slope. For now, assume that C, is very large, which means that the common node between two lines is ac-grounded.

By applying KCL and KVL and using approximate partial derivatives with respect to distance x from the beginning of the line, where the voltage on the line is V(x, t), one can easily obtain Equation (38) as follows:

$$\frac{\partial^2 V}{\partial x^2} = L\frac{\partial}{\partial t}\left[C(V)\frac{\partial V}{\partial t}\right] + 2\sqrt{LC_0}\,\alpha\frac{\partial V}{\partial t}$$

This approximation is valid when the dispersion effect caused by discreteness is negligible due to a small spacing between adjacent LC elements compared to the signal wavelength. A term of Equation (38) is given by Equation (39) as follows:

$$\alpha = \frac{1}{2}\left(GZ_0 + \frac{R}{Z_0}\right)$$

In Equations (38) and (39), L, C, G, and R are unit length inductance, capacitance, parasitic conductance, and parasitic resistance, respectively. $Z_0$ is the characteristic impedance defined by squareroot($L/C_0$).

Pump and signal are applied to the left end of the transmission line, and the pump frequency is set to be twice the signal frequency. Note that the signal is applied differentially between two lines whereas the pump is common-mode, as shown in FIG. 1. Then, Equation (38) can be written for a differential signal as Equation (40) as follows:

$$\frac{\partial^2 V_s}{\partial x^2} = LC_0\frac{\partial^2 V_s}{\partial t^2} + LC_0 b\frac{\partial^2 (V_s \cdot V_p)}{\partial t^2} + 2\sqrt{LC_0}\,\alpha_s\frac{\partial V_s}{\partial t}$$

where $V_S$ and $V_P$ are the signal and pump voltages on the transmission line, respectively. $\alpha_S$ is the transmission line loss for the signal frequency.

In Equation (40), the first term on the right corresponds to the linear wave propagation and the third term represents the loss of the transmission line. The second term on the right represents the nonlinear coupling between pump and signal, which results in the parametric amplification. From coupled-mode theory, the signal can be written according to Equations (41) and (42) as follows:

$$V_S(x,t)=V_S(x)e^{j\omega t}+V_S^*(x)e^{-j\omega t}$$

$$V_S(0,t)=A_S\cos(\omega t+\phi)$$

where $V_S(x)=A(x)e^{-j\beta x}$, $V_S^*(x)=A^*(x)e^{j\beta x}$, $\beta$ is the signal propagation constant, and $\phi$ is the initial phase difference between signal and pump at x=0. Here, "*" denotes the complex conjugate. A(x) and A*(x) are slowly varying functions over x which means $\partial A/\partial x \ll \beta A$.

Assume that the pump is a sinusoidal function at a frequency of $\omega p=2\omega$. Then, the pump can be written as Equations (43) and (44) as follows:

$$V_p(x, t) = A_p(x)\cos(\omega_p t - \beta_p x)$$

$$= \frac{1}{2}A_p(x)[e^{j(\omega_p t - \beta_p x)} + e^{-j(\omega_p t - \beta_p x)}]$$

where $A_P(x)$ is the amplitude of the pump, which is a slowly varying function over x, and $\beta_P$ is the pump propagation constant.

By substituting Equations (41) and (44) into Equation (40), and by approximating $\beta \approx \omega$(squareroot ($LC_0$)) (small dispersion assumption) and $\beta_P=2\beta-\Delta\beta$ zthe dispersion might not be negligible for pump which is at twice the input frequency), we derive the active coupled-mode equations for A(x) and A*(x) as Equations (45) and (46) as follows:

$$\frac{\partial A}{\partial x} = -\frac{j\beta b A_p}{4}A^* e^{j\Delta\beta x} - \alpha_s A$$

$$\frac{\partial A^*}{\partial x} = \frac{j\beta b A_p}{4}A e^{-j\Delta\beta x} - \alpha_s A^*$$

For now, $A_P$ is assumed to be constant over x to obtain an analytic solution of Equations (45) and (46). This assumption means that we neglect the pump loss in the transmission line and the transferred pump energy to the signal frequency. Under this assumption, the general solution for Equations (9) and (1) is given by Equations (47) and (48) as follows:

$$A = e^{(-\alpha_s + j\Delta\beta/2)x}(A_1 e^{sx} + A_2 e^{-sx})$$

where $$s = \sqrt{\left(\frac{\beta b A_P}{4}\right)^2 - \left(\frac{\Delta\beta}{2}\right)^2}$$

and $A_1$ and $A_2$ are constants over x.

By applying the boundary condition of Equations (42) to (45), the complete solution is obtained as Equations (49), (50 and (51) as follows:

$$V_s(x,t) = A_s e^{-\alpha_s x}[C_1 \cos(\omega t - \beta x) + S_1 \sin(\omega t - \beta x)]$$

where $$C_1(x,\phi) = \cos h(s_0 x)\cos \phi - \sin h(s_0 x)\sin \phi$$

$$S_1(x,\phi) = \sin h(s_0 x)\cos \phi - \cos h(s_0 x)\sin \phi$$

and $\Delta_0 = \beta b A_P/4$ is the first term on the right side of Equation (48). It is noteworthy that in Equation (49) we have assumed no dispersion for pump ($\Delta\beta=0$). At the end of this section, we will introduce a method to compensate the dispersion for pump, validating this assumption.

From Equation (49), the amplitude of the signal is given by Equation (52) as follows:

$$|V_s(x)| = A_s e^{-\alpha_s x}\sqrt{\cosh(2s_0 x) - \sinh(2s_0 x)\sin 2\phi}$$

The plot of calculated parametric gain based on Equation (52) to show the effect of initial phase difference between pump and signal for different nonlinear factors is set for in the Inventors' Amplifier Article. We assume that the quality factor of the transmission line for a signal frequency is 10 which corresponds to $\alpha_s = 0.04$ m. As the nonlinear factor increases, the gain plot shows a higher amplification and attenuation depending on the phase difference. For the maximum and minimum gains, the signal is exponentially growing or decaying over x as characterized by Equation (53) as follows:

$$G(x) = \frac{|V_s(x)|}{A_s} = \begin{cases} e^{(s_0 - \alpha_s)x} & \text{for } \phi = -\frac{\pi}{4}(\max.) \\ e^{-(s_0 + \alpha_s)x} & \text{for } \phi = \frac{\pi}{4}(\min.) \end{cases}$$

where $s_0 = \beta b A_P/4$. The phase difference between the maximum and minimum is $\pi/2$, which clearly shows the phase-sensitive gain for quadrature signals.

Intuitively, at each section of the line, the nonlinear interaction between the signal at $\omega$ and the pump at $2\omega$ generates two frequency components at $3\omega$ and $\omega$. The $3\omega$ component is suppressed by the cut-off frequency of the transmission line, and the $\omega$ component is added to the signal. However, this adding process can be constructive or destructive, depending on the phase difference between signal and pump. A series of this process over multiple sections enables the gain to exponentially grow (energy transfer from the pump to the signal) or to be attenuated (energy transfer from the signal to the pump). When the pump frequency is exactly twice signal frequency, the parametric amplification is called degenerate, mainly characterized with its phase-sensitive gain.

Note that the exponent, $s_0$, in Equation (53) is proportional to the propagation constant, $\beta$, as well as the varactor C/V slope and the pump amplitude. This is because the increase in the propagation constant is equivalent to the increase in the effective transmission line length. However, the increase in the propagation constant also lowers the cut-off frequency and decreases the pump amplitude. Therefore, the propagation constant should be carefully selected.

The above analysis neglects the effect of dispersion ($\Delta\beta=0$). However, the discreteness of the artificial transmission line causes non-negligible dispersion and results in an undesired phase shift between the pump and the signal, weakening the parametric coupling between them. The inventors' Amplifier Article includes a graph that shows how the propagation constant mismatch degrades the parametric gain. In addition to the drop in the exponential constant in Equation (48), an even more serious effect comes from accumulating the phase mismatch due to differences in the propagation constant. A small phase mismatch is accumulated over multiple sections to reach a certain amount of phase difference between pump and signal, causing attenuation instead of amplification and leading to the curve of the gain plot having a limited maximum gain over the section number.

Figure 14:
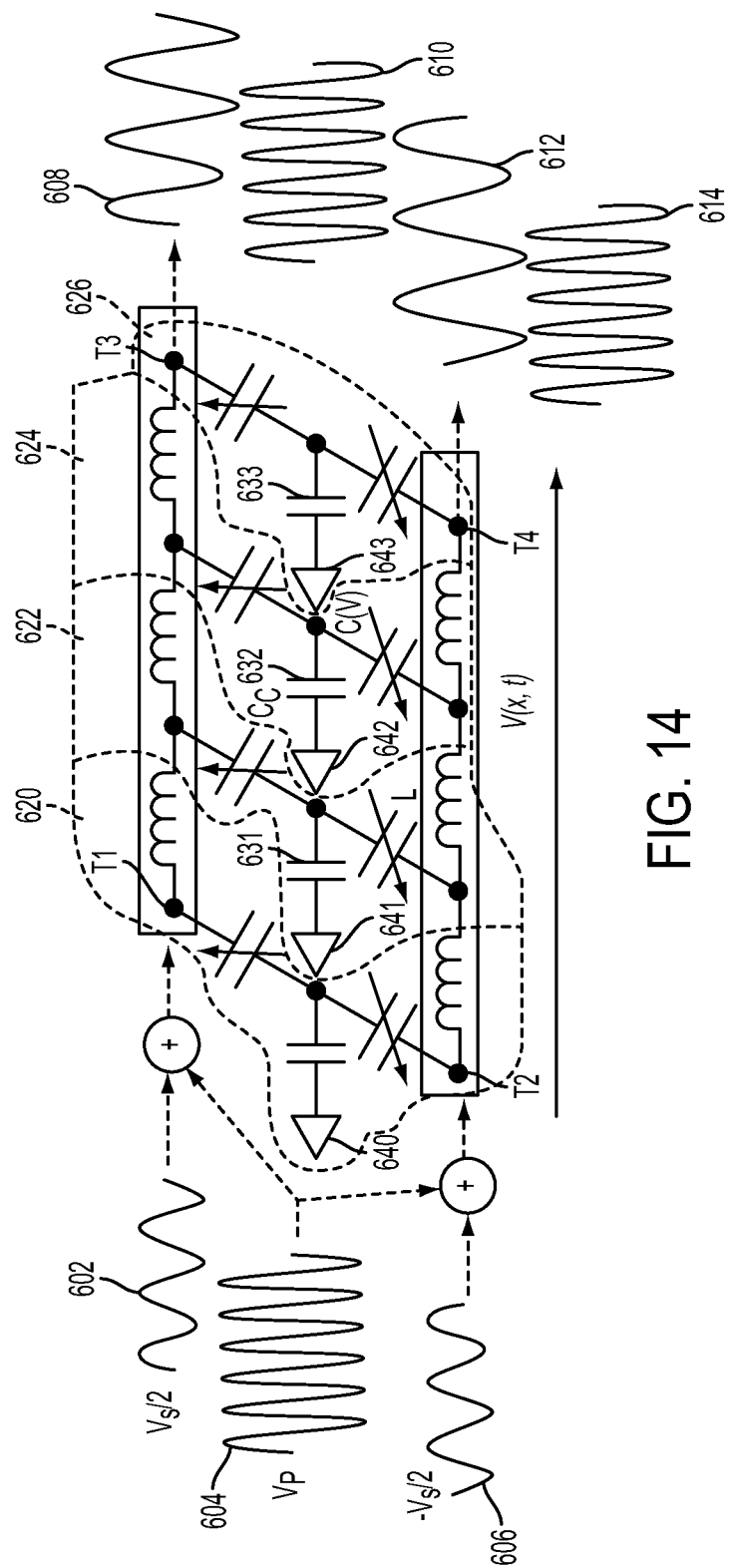
FIG. 14 is a schematic view of a fifth embodiment of a resonator circuit according to the present invention.
Figure 15A:
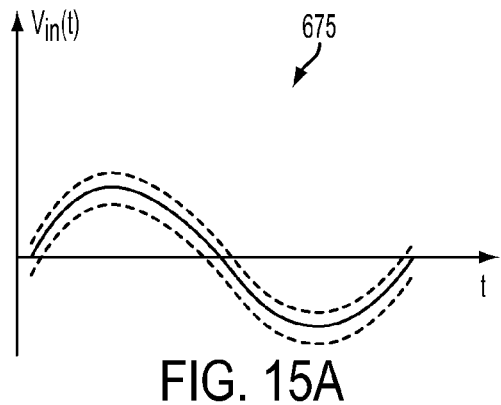
FIGS. 15A, 15B, 15C, 15D, 15E and 15F are graphs showing information helpful in understanding the present invention.
Figure 15B:
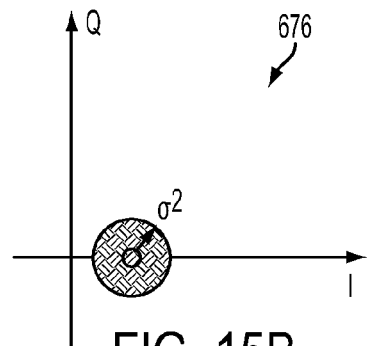
Figure 15C:
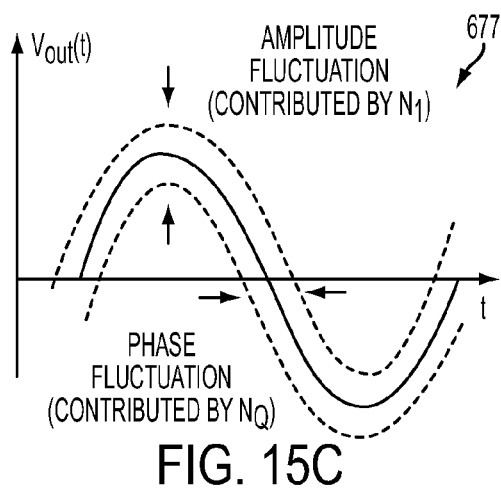
Figure 15D:
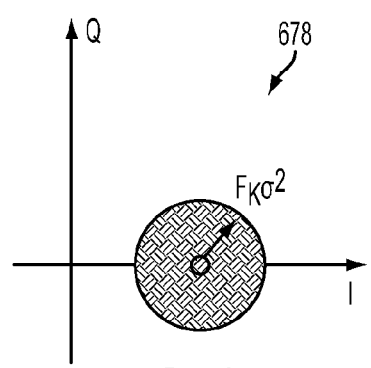
Figure 15E:
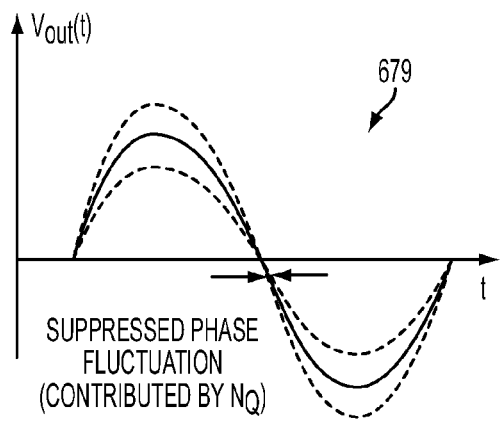
Figure 15F:
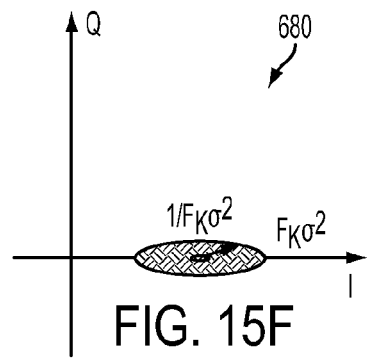

To maintain $\Delta\beta=0$, we have introduced the dispersion compensation capacitors 630,631,632,633 (each having a fixed capacitance value of $C_C$) at the common nodes between the variable capacitors of each capacitor sub-module (each having a capacitance function of C(V)), as shown in FIG. 14. These dispersion compensation capacitors only affect the common-mode pump because the differential signal is not affected by them due to the virtual grounds 640,641,642,643 in the middle nodes. With the dispersion compensation capacitors, the net average capacitance for the pump drops to $C_0$ in series with $C_C/2$, decreasing the pump propagation delay without changing the signal propagation. By selecting the right value for C, one can completely phase-match the signal and pump.

FIG. 14 shows: (i) three capacitor-inductor modules 620, 622,624 (each including a capacitor sub-module connected between two transmission line portions, with each transmission line portion including an inductive element); and (ii) a capacitor sub-module 626 without any associated transmission line portions. In portion 601, the capacitor sub-modules each include two variable capacitor, one fixed capacitor and a virtual ground. Other, not necessarily currently preferred, capacitor sub-modules may be structured and/or connected differently, but they must always include at least one variable capacitor connected across nodes of two parallel transmission lines. In some embodiments, there will be two variable capacitors connected in series, each with an identical characteristic capacitance function. In some embodiments, the common node between two series-connected variable capacitors will be electrically connected (see DEFINITIONS section) to some fixed voltage (for example, a virtual ground). In some embodiments, the common node connection to the fixed voltage will be made through a fixed capacitance capacitor.

Noise of degenerate parametric amplifiers according to the present invention will now be discussed. Because the degenerate parametric process uses only passive components, potentially it can achieve better noise figure (NF) than the conventional transistor-based amplifiers. In addition, its phase-sensitive gain shows an interesting property: noise squeezing. The equi-partition theorem suggests that the input noise, usually thermal noise, is circularly symmetric for two quadrature components in a thermal equilibrium and can be written as a narrow band representation, for carrier (signal) frequency $\omega$, as Equations (54) and (55) as follows:

$$n(t) = n_I(t)\cos\omega t + n_Q(t)\sin\omega t$$

$$\overline{n_I^2(t)} = \overline{n_Q^2(t)} \cong \sigma^2$$

where $n_I(t)$ and $n_Q(t)$ are slowly varying functions compared to a sinusoidal function at $\omega$.

When n(t) is injected into a degenerate parametric amplifier with k-sections pumped at $2\omega$ and the pump has the right phase so that $n_I(t)$ experiences the maximum gain, then $n_Q(t)$ has the maximum attenuation based on Equation (53), as shown by the following Equations (56) and (57):

$$\overline{n_I^2(t)}_{out} = e^{2(S_0-\alpha_d)k}\sigma^2 = e^{-2\alpha_d k}F_k\sigma^2$$

$$\overline{n_Q^2(t)}_{out} = e^{-2(S_0+\alpha_d)k}\sigma^2 = e^{-2\alpha_d k}\frac{1}{F_k}\sigma^2$$

where the squeezing factor, $F_k$, is defined by Equation (58) as follows:

$$F_k = e^{2S_0 k}$$

In the absence of the loss of transmission line, the multiplication of the standard deviations of $n_I(t)$ out and $n_Q(t)$ out is given by Equations (59) and (60) as follows:

$$\sqrt{\overline{n_I^2(t)}}_{out} \cdot \sqrt{\overline{n_Q^2(t)}}_{out} = \sqrt{F_k}\,\sigma \cdot \frac{1}{\sqrt{F_k}}\sigma = \sigma^2$$

$$= \sqrt{\overline{n_I^2(t)}} \cdot \sqrt{\overline{n_Q^2(t)}}.$$

Equation (60) shows that the multiplication of two quadrature noise components is preserved with the initial one, since one quadrature noise component (out-of-phase) is suppressed at the expense of amplifying the other quadrature noise component (in-phase) through phase-sensitive amplification. Assuming that thermal noise caused by power dissipation on the transmission line is negligible and that the signal information is only in the in-phase direction, the NF of the parametric amplifier is given by Equation (61) as follows:

$$NF = \frac{SNR_{IN}}{SNR_{OUT}} = \frac{\frac{v_s^2}{n_I^2 + n_Q^2}}{\frac{F_k v_s^2}{F_k n_I^2 + 1/F_k n_Q^2}} = \frac{1}{2}\left(1 + \frac{1}{F_k^2}\right)$$

where $n_I^2 = n_Q^2 \approx \sigma_2$ and $v_S$ is a signal amplitude.

Surprisingly, Equation (61) shows that NF approaches −3 dB as the squeezing factor, $F_k$, increases. In other words, the noise is redistributed from a circular to an oval shape through parametric amplification to have a higher SNR in one quadrature direction. FIGS. 15A to 15F shows a time-domain observation of the noise squeezing effect and the noise distribution over the phase. FIGS. 15A to 15F shows a series of graphs 675, 676, 677, 678, 679, 680, 681 that show observation of squeezed output noise by phase-sensitive amplification in a time and phase domain compared to linear amplification.

Graphs 675 and 676 show input signal. Graphs 677 and 678 show output signal through linear amplification. Graphs 679 and 680 show output signal through phase sensitive amplification. To simplify the notations, the phase of the pump is shifted by $\pi/2$. In Equation (53), the signal has its maximum and minimum at $\phi=0$ and $\phi=\pi/2$, respectively.

The output of the parametric amplifier can be written as Equations (62), (63) and (64) as follows:

$$v_{out}(t) = e^{-\alpha_d k}\sqrt{F_k}\,v_s(t)\cos(\omega t - \theta) + n_{out}(t)$$
$$= e^{-\alpha_d k}\sqrt{F_k}\,[v_s(t) + n_I(t)]\cos(\omega t - \theta - \zeta)$$

where $$\zeta = \tan^{-1}\left(\frac{n_Q(t)}{F_k v_s}\right) \cong \frac{n_Q(t)}{F_k v_s}$$

and $\theta$ is the phase shift due to propagation delay over the transmission line. Equation (63) shows that $n_I(t)$ contributes to the amplitude fluctuation whereas $n_Q(t)$ contributes to the phase fluctuation. Equations (63) and (64) explain how the squeezing suppresses the phase (timing) fluctuation at the output by increasing the amplitude fluctuation with the same ratio. This is fundamentally different than a linear amplifier (phase insensitive amplifier) that provides the same amount of amplification for two quadrature components resulting in a circularly symmetric output noise distribution.

Next, we take into account the effect of loss of transmission line in parametric amplifier NF. The parametric amplifier consists of two transmission lines that generate two independent noises, $v_{n1i}$ and $v_{n2i}$, at ith node. Because only differential signal is amplified, the output noise contributed by the power dissipation at ith node is given by Equations (65) and (66) as follows:

$$\overline{v_{nout}^2}\Big|_i = \frac{e^{-2\alpha_d(k-i)}}{2}\left(F_{k-i} + \frac{1}{F_{k-i}}\right)\left(\overline{v_{n1i}^2} + \overline{v_{n2i}^2}\right)$$
$$= 2e^{-2\alpha_d(k-i)}\cosh[2S_0(k-i)]\overline{v_{n1i}^2}$$

The thermal noise power generated at the ith node that travels toward output is given by Equations (67) and (68) as follows:

$$\overline{v_{n1i}^2} = kTBR + kTBGZ_0^2$$
$$= 2kTBZ_0\left(\frac{R}{2Z_0} + \frac{GZ_0}{2}\right) = 2kTBZ_0\alpha_d$$

where B is the bandwidth over which the noise is measured. Combining (30) and (32), the total output noise associated with transmission line loss is given by Equation (69) as follows:

$$\overline{v_{nout}^2} = 4kTBZ_0\alpha_d\sum_{i=1}^{k}e^{-2\alpha_d i}\cosh(2S_0 i)$$

From Equations (61) and (69), NF is given by Equation (70) as follows:

$$NF = \frac{1}{2}\left(1 + \frac{1}{F_k^2}\right) + \frac{2\alpha_d}{F_k} \sum_{i=1}^{k} e^{2\alpha_d(k-i)} \cosh(2S_0 i)$$

where the input signal source impedance is matched with the characteristic impedance, $Z_0$. In the absence of the pump ($F_k$=1), from Equation (70) the NF is simply approximated with $e^{pwr}$ (where pwr equals $2\alpha_d k$), which is the reciprocal of transmission line loss and is expected from a conventional transmission line.

Some calculated NF graphs for embodiments of the present invention appear in the Inventors' Amplifier Article. When the transmission line is lossless, the amplifier NF approaches −3 dB for large nonlinear factors. However, the transmission line loss significantly degrades the NF. The phase sensitivity of NF is also investigated in the Inventors' Amplifier Article. Since the input noise distribution is assumed to be circularly symmetric and independent of input signal, the variation of the NF is caused only by change in the signal gain. Note that FIG. 4(b) is a flip-down image of FIG. 2(a).

As further shown in the Inventors' Amplifier Article, NF can also be calculated as a function of the section number. As the section number increases, the squeezing effect exponentially increases, resulting in a better NF. However, in the presence of transmission loss, the number of noise sources also increases with section number. Therefore, for a given nonlinearity, an optimum number of sections should be chosen by the designer to result in a minimum NF.

The effect of pump loss will now be discussed. The previous sections examined the signal gain and NF in the absence of pump attenuation for an analytical solution. However, pump loss can be important to consider because the signal gain is an exponential function of the pump amplitude, as shown in Equation (53). The Inventors' Amplifier Article shows the simulated pump loss effect on the gain and NF based on Equations (45) and (46) when the phase difference between signal and pump is −π4 for a maximum gain. When pump loss is negligible, the log-scale gain is linearly proportional to the section number in accordance with Equation (53). However, as the pump loss increases, the amplifier gain reaches a peak for a certain number of sections. Before this point, because the pump amplitude is large, the gain increases as the signal propagates. After this point, the pump amplitude is too low to compensate the loss of the transmission line, resulting in a lower gain. For a higher pump loss this optimal number of sections also decreases, thereby causing the lower gain peak. Considering that the typical value of the quality factor of the transmission line is around 10 for a pump frequency of 20 GHz, the maximum gain is only 5 dB with 22 sections. Some embodiments of the present invention inject the pump frequency at multiple points of the transmission line to compensate the loss. However, these embodiments require higher pump power and also result in a more complex design and larger footprint.

Pump loss also degrades NF. Loss results in pump attenuation which in turn translates to a lower squeezing effect. This is shown in the Inventors' Amplifier Article.

Figure 16A:
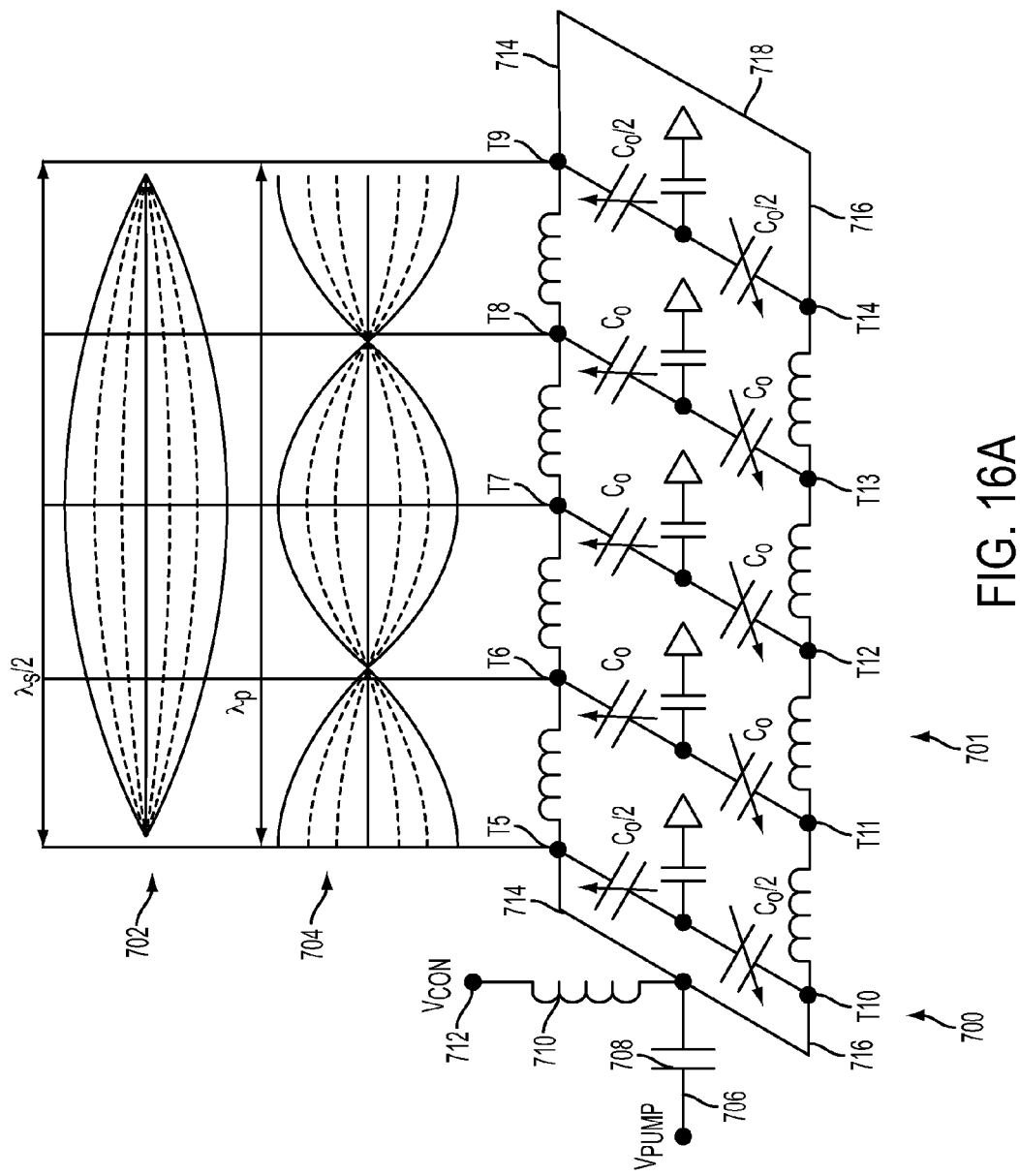
FIGS. 16A, 16B and 16C together form a schematic view of a first embodiment of an amplifier circuit according to the present invention.
Figure 16B:
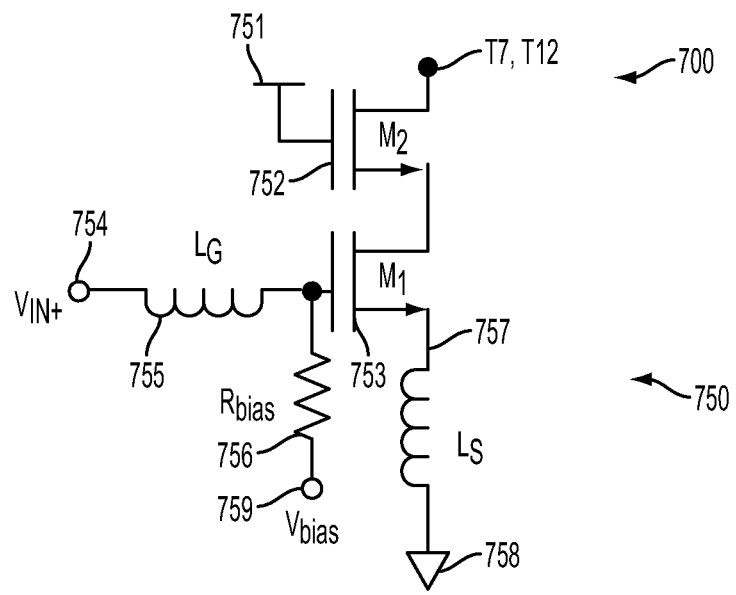
Figure 16C:
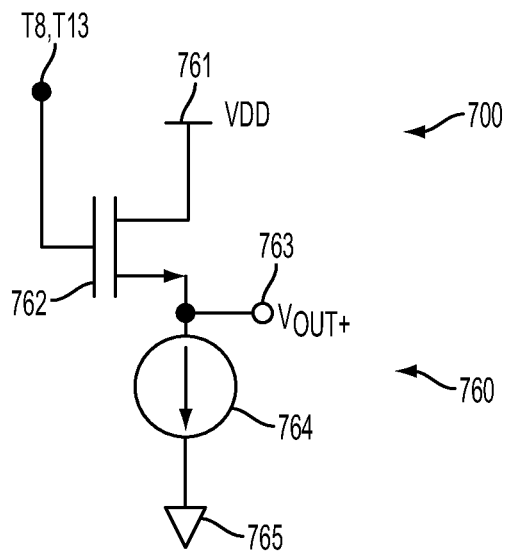

As shown in FIGS. 16A, 16B and 16C show a resonant parametric amplifier 700 according to the present invention. Amplifier circuit 700 includes: resonator portion 701; nodes T5,T6,T7,T8,T9,T10,T11,T12,T13,T14; signal (differential) waveform 702; pump (common-mode) waveform 704; pump 706; first fixed capacitor 708; first inductor 710; $V_{CON}$ terminal 712; first transmission line 714; second transmission 716; loop end current carrier 718; differential signal input module 750 (two occurrences at T7 and T12); and second differential signal output module 760 (two occurrences at T8 and T13). As shown in FIG. 16B, signal input module 750 includes: gate voltage 751; second N-channel MOSFET 752; first N-channel MOSFET 753; VIN terminal 754; first inductor 755; first resistor 756; second inductor 757; ground 758; and $V_{BIAS}$ terminal 759. As shown in FIG. 16C, differential signal output module 760 includes: drain voltage level 761; first N-channel MOSFET 762; $V_{OUT}$ terminal 763; component 764; and ground 765.

As shown in FIG. 16A, the resonator portion includes capacitor-inductor modules as follows: (i) a first module with its constituent capacitor sub-module connected between T5 and T10; (ii) a second module with its constituent capacitor sub-module connected between T6 and T11; (iii) a third module with its constituent capacitor sub-module connected between T7 and T12; (iv) a fourth module with its constituent capacitor sub-module connected between T8 and T13. As further shown in FIG. 16A, there is an additional capacitor sub-module, which is not part of a capacitor-inductor module, connected across the ends of the transmission lines distal from the pump between T9 and T14. As with the resonator circuits for frequency dividers, discussed in the previous section, the variable capacitors of the capacitor sub-modules that are nearest and furthest from the pump have an average capacitance ($C_0/2$) that is half the value of the other variable capacitors ($C_0$) of the other, intermediate capacitor sub-modules. As discussed in connection with previous resonator portion embodiments, the capacitor sub-modules are each grounded through a fixed capacitor at their respective common nodes.

FIGS. 16A to 16C show a parametric resonant amplifier with input low-noise amplifier and output buffer. The upper side of the figure shows the different standing wave formations for signal and pump.

To overcome the challenges of traveling-wave structures associated with a large number of lumped LC elements and pump loss, we propose using a resonant amplifier based on a parametric oscillator structure. For a parametric oscillator, we only need enough gain to compensate the loss, which is achievable with a small number of sections. By operating this parametric oscillator with a pump below the oscillation threshold, another form of degenerate parametric amplification can be achieved.

FIGS. 16A to 16C illustrate the parametric resonator with a differential input signal. The effective length of the four-LC-section resonator is equal to a pump wavelength, $\lambda_P$, which is half of the signal wavelength, $\lambda_S$. The pump is injected into the left end and the input signal is applied to the middle of the resonator through a transconductance amplifier. The output port is selected at the "$3/4 \lambda_P$" location to suppress the pump signal by exploiting the different standing wave formations for signal and pump, as shown by waveforms 702 and 704 as shown in FIG. 16A. Note that the differential signal sees both ends of the resonator as short circuit, whereas the common-mode pump sees them as open ports. The source followers are simply used as output buffers to drive a 50Ω output load.

The performance of amplifier 700 is analyzed at length in the Inventors' Amplifier Article, with reference to many additional equations. For example, a fundamental limit of the maximum squeezing ratio is determined to be 6 dB for amplifier 700. Equations for determining the total gain of amplifier 700 are also provided.

Figure 17:
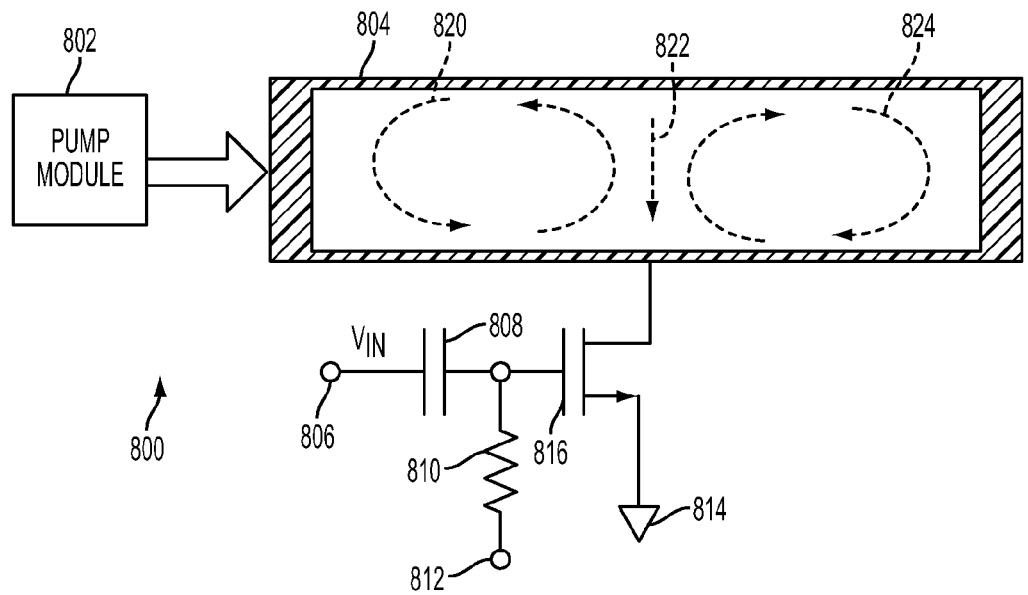
FIG. 17 is a schematic view of a second embodiment of an amplifier circuit according to the present invention.

FIG. 17 shows amplification using a parametric resonator with a pump level below the oscillation threshold. FIG. 17 shows amplifier 800, including: pump module 802; resonator circuitry 804; energy flows 820,822,824; $V_{IN}$ terminal 806; first capacitor 808; first resistor 810; terminal 812; second capacitor 816; and ground 814. The Inventors' Amplifier Article compares the performance of amplifier 800 with that of a conventional amplifier circuit and shows how to calculate the minimum NF based on the squeezing effect, assuming that the noise of the resonator itself is negligible. This is similar to the calculation of the NF of a conventional low noise amplifier (LNA) where we assume that the effect of loss of the resonator is negligible and the NF is dominated by the channel noise.

Design and simulation will now be discussed. We designed and simulated the proposed amplifier around 10 GHz in a 65 nm CMOS technology. The chip consumes 30 mW from a 1.2-V supply. This power includes the pump generation circuit, which consumes 14.5 mW. The entire chip occupies 1.5 mm×0.9 mm and a photograph of it is shown in the Inventors' Amplifier Article. The design of an example amplifier according to the present invention consists of three parts: a nonlinear resonator for phase-sensitive gain, a low noise amplifier for input stage, and a frequency doubler to generate a pump frequency that has exactly twice input frequency. To design the resonator, first we set its cut-off frequency for maximum gain, as discussed above. In this example design, this optimum value is 25 GHz to facilitate the propagation of the signal and pump and filter the higher frequency components. This cutoff frequency determines the product of the inductance and capacitance. The number of sections is set to four, as discussed previously. These values for the section number and the cut-off frequency can be used to create a resonant frequency of 10 GHz. Then, the dispersion compensation capacitor is determined by the phase-matching condition between the pump and the signal. The phase matching can be verified by making sure that the resonance frequency of $S_{11}$ is exactly 20 GHz. Without the dispersion compensation, $S_{11}$ has a resonance frequency lower than 20 GHz. Finally, depending on the magnitude of the input matching, the characteristic impedance can be selected, which gives the ratio of inductance and capacitance. The design of the low-noise amplifier for input stage follows a general source-degenerated amplifier for an input frequency of 10 GHz. The input impedance is matched to 50Ω. The main transistor (M1 in FIG. 16B) has a width of 96 μm for optimum NF and input matching with a bias current of 3 mA. The width of the cascode transistor (M2 in FIG. 16B) is selected considering the tradeoff between the amount of parasitic capacitances and its noise contribution. In this example design the width of M2 is 80 μm. Both M1 and M2 have a minimum channel length of 60 nm.

Figure 18A:
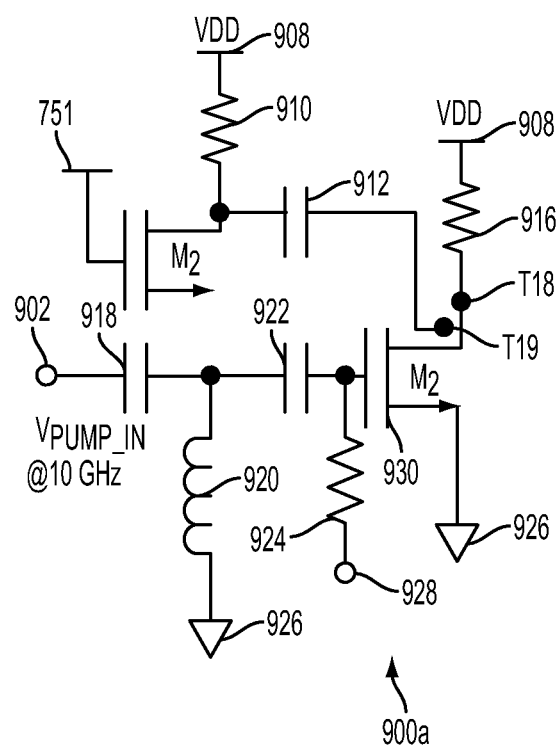
FIGS. 18A, 18B and 18C together form a schematic view of a first embodiment of a frequency doubler circuit for use in the present invention.
Figure 18B:
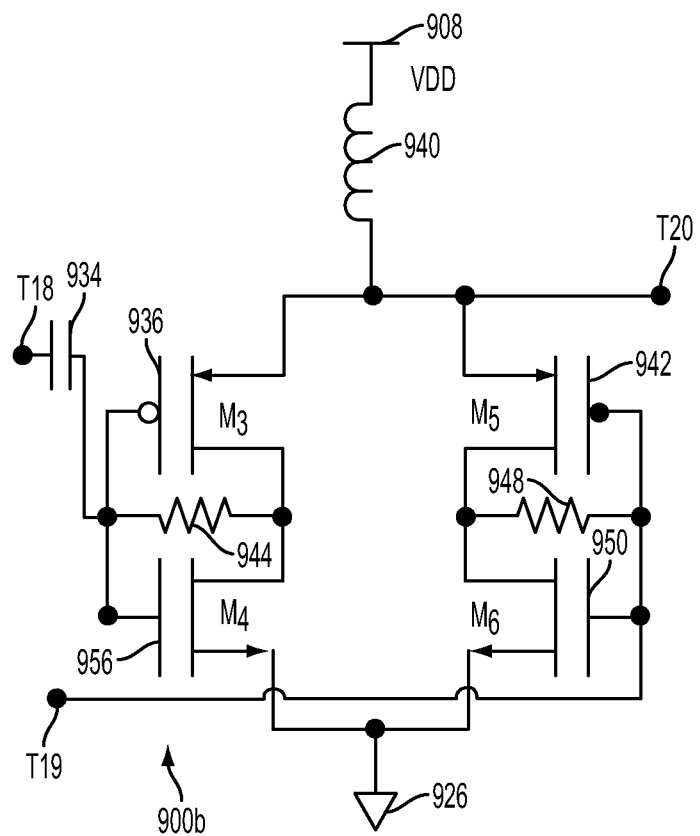
Figure 18C:
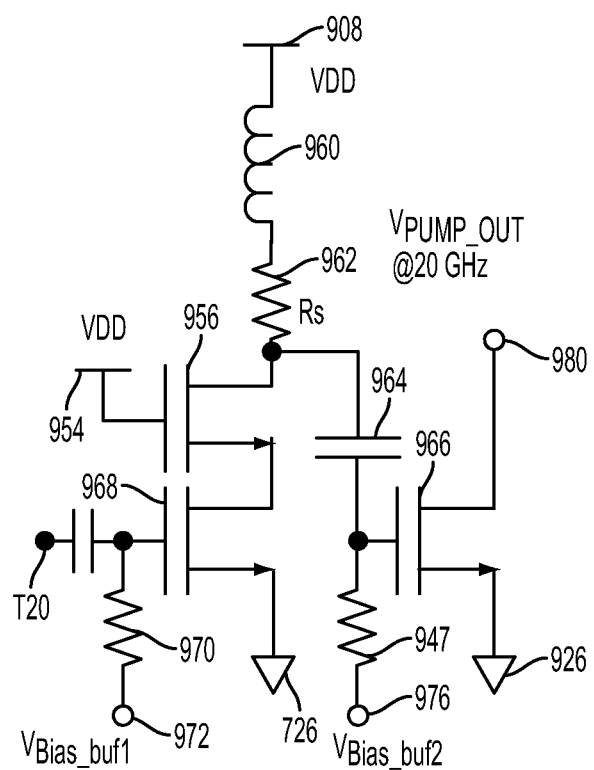

Frequency doubler circuit 900a,900b,900c is shown in FIGS. 18A, 18B and 18C. active balun portion 900a includes: nodes T18,T19; $V_{PUMP\_In}$ terminal 902; gate voltage 9094; first transistor 906; $V_{DD}$ voltage 908; first resistor 910; first capacitor 912; second resistor 916; second capacitor 918; first inductor 920; third capacitor 922; third resistor 924; ground 926; $V_{BIAS\_BALUN}$ terminal 928; and second transistor 930. Frequency doubler portion 900b includes: nodes T18,T19, T20; first capacitor 934; first transistor 936; $V_{DD}$ terminal 908; first inductor 940; second transistor 942; first resistor 944; third transistor 946; second transistor 948; fourth transistor 950; and ground 926. Buffer portion 900c includes: node T20; $V_{DD}$ terminal 908; first transistor 956; first inductor 960; first resistor 962; first capacitor 964; second transistor 966; third transistor 968; second resistor 970; $V_{BIAS\_BUF1}$ terminal 972; second resistor 974; $V_{BIAS\_BUF2}$ terminal 976; and $V_{PUMP\_OUT}$ terminal 980.

To generate the pump at twice signal frequency, the frequency doubler is implemented as shown in FIGS. 18A to 18C. It consists of an active balun (FIG. 18A), a frequency doubler (FIG. 18B), and a buffer (FIG. 18C). Because the frequency doubler is designed for a differential input signal, an active balun is employed. The active balun (M1-M2 in FIG. 18A) is the combination of the common-gate and common-source amplifiers to simultaneously generate a non-inverting and inverting output. In addition, the common gate amplifier located in the input port provides a broadband input matching. The frequency doubler (M3-M6 in FIG. 18B) uses the nonlinearity of the transistor. The even-order harmonics of the differential input signal, mainly the second order harmonic, is picked at the common node through the resonant network. The last stage transistors (M7-M9 in FIG. 18C) is a two-stage amplifier as a buffer. The first stage amplifies the signal with a high gain, and the second stages drives the nonlinear resonator. By adjusting the resistor 962 in the resonant network (by adjusting the quality factor), we can guarantee enough tuning range for the operation frequency. The Inventors' Amplifier Article provides a simulated output amplitude of the pump generation block versus an input amplitude for different input frequencies in Cadence.

The Inventors' Amplifier articles provides a Cadence simulation for the designed amplifier that consists of the input stage amplifier and the nonlinear resonator and some associate graphs including: (i) a determination of a minimum NF of −0.37 dB when the gain is maximum; (ii) how an increase in pump amplitude boosts the gain by increasing the quality factor of the resonator; (iii) how the NF is more suppressed as the difference between maximum and minimum gain increases with pump amplitude due to the squeezing effect; (iv) how the increase in pump amplitude decreases the signal gain for a phase at minimum gain; (v) how he destructive adding process causes more signal attenuation inside the resonator with the pump amplitude, degrading the quality factor; (vi) how NF becomes worse due to loss of the signal; (vii) the simulated noise squeezing, depending on the presence of the pump; (viii) how the out-of-phase noise component is suppressed in the presence of the pump signal, whereas the in-phase noise component is amplified; (ix) how the input signal is also equally amplified with the in-phase noise component; and (x) how the standard deviation of the out-of-phase noise component is significantly suppressed with pump injection.

Figure 19:
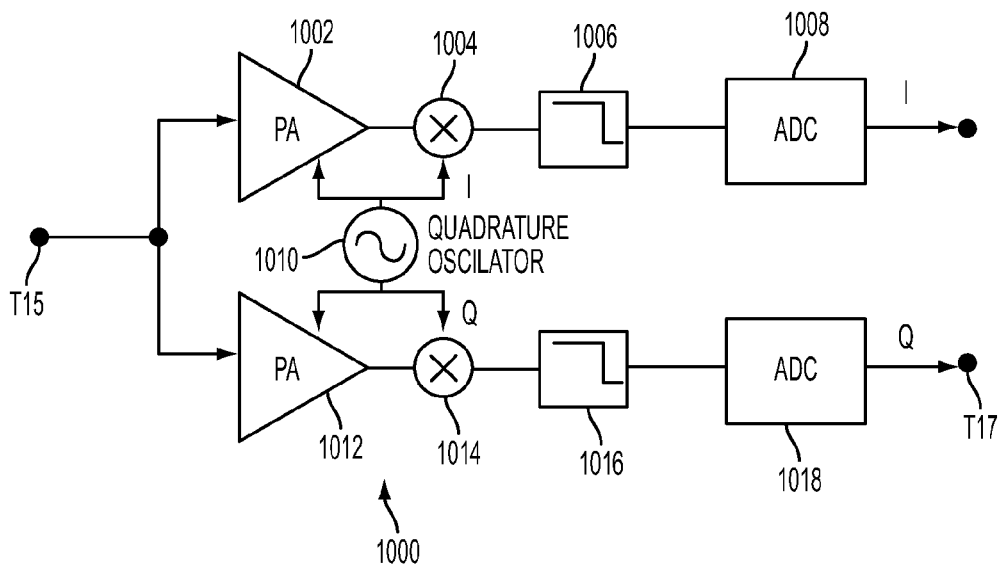
FIG. 19 is a schematic view of a receiver front end including an amplifier according to the present invention.

FIG. 19 shows a receiver front end using an amplifier according to the present invention to detect I/Q modulated signal. As shown in FIG. 19, amplifier circuit 1000 includes: nodes T15,T16,T17 first amplifier 1002; first component 1004; second component 1006; first analog to digital converter 1008; second amplifier 1012; third component 1014; fourth component 1016; and second analog to digital converter 1018.

Amplifier circuit 1000 can be used to detect narrow-band I/Q-modulated signal with a low noise figure in the receiver front end, as shown in FIG. 19. We place two proposed amplifiers for each I/Q branch, and the pump frequency can be generated from the received signal using clock recovery circuits and the frequency doubler. In another application, we can exploit the phase-sensitive gain to convert the phase information into amplitude information, as in the phase interpolator and the radar application.

We propose a resonant parametric amplifier with a low NF using the noise squeezing effect. The phase-sensitive amplification process suppresses one of the quadrature noise components and achieves around 3-dB NF reduction compared to the phase-insensitive amplification. The resonant structure of the amplifier enables parametric amplification for narrowband signals with a small number of lumped LC elements. The signal gain and NF are analyzed theoretically based on the continuous transmission line approximation and the steady state assumption. We achieved a minimum NF of −0.35 dB for one of the quadrature components for a 10-GHz narrow band signal in Cadence simulation, which is the lowest NF in a CMOS process.

DEFINITIONS

Any and all published documents mentioned herein shall be considered to be incorporated by reference, in their respective entireties. The following definitions are provided for claim construction purposes:

Present invention: means "at least some embodiments of the present invention," and the use of the term "present invention" in connection with some feature described herein shall not mean that all claimed embodiments (see DEFINITIONS section) include the referenced feature(s).

Embodiment: a machine, manufacture, system, method, process and/or composition that may (not must) be within the scope of a present or future patent claim of this patent document; often, an "embodiment" will be within the scope of at least some of the originally filed claims and will also end up being within the scope of at least some of the claims as issued (after the claims have been developed through the process of patent prosecution), but this is not necessarily always the case; for example, an "embodiment" might be covered by neither the originally filed claims, nor the claims as issued, despite the description of the "embodiment" as an "embodiment."

First, second, third, etc. ("ordinals"): Unless otherwise noted, ordinals only serve to distinguish or identify (e.g., various members of a group); the mere use of ordinals shall not be taken to necessarily imply order (for example, time order, space order).

Electrically Connected: means either directly electrically connected, or indirectly electrically connected, such that intervening elements are present; in an indirect electrical connection, the intervening elements may include inductors and/or transformers.

Module/Sub-Module: any set of hardware, firmware and/or software that operatively works to do some kind of function, without regard to whether the module is: (i) in a single local proximity; (ii) distributed over a wide area; (ii) in a single proximity within a larger piece of software code; (iii) located within a single piece of software code; (iv) located in a single storage device, memory or medium; (v) mechanically connected; (vi) electrically connected; and/or (vii) connected in data communication.

Unless otherwise explicitly provided in the claim language, steps in method or process claims need only be performed that they happen to be set forth in the claim only to the extent that impossibility or extreme feasibility problems dictate that the recited step order be used. This broad interpretation with respect to step order is to be used regardless of alternative time ordering (that is, time ordering of the claimed steps that is different than the order of recitation in the claim) is particularly mentioned or discussed in this document. Any step order discussed in the above specification, and/or based upon order of step recitation in a claim, shall be considered as required by a method claim only if: (i) the step order is explicitly set forth in the words of the method claim itself; and/or (ii) it would be substantially impossible to perform the method in a different order. Unless otherwise specified in the method claims themselves, steps may be performed simultaneously or in any sort of temporally overlapping manner. Also, when any sort of time ordering is explicitly set forth in a method claim, the time ordering claim language shall not be taken as an implicit limitation on whether claimed steps are immediately consecutive in time, or as an implicit limitation against intervening steps.

What is claimed is:

1. A resonator circuit comprising:
   a pump module;
   a first transmission line;
   a second transmission line; and
   a set of capacitor sub-module(s);
   wherein:
   the first transmission line has a first end and a second end and a plurality of inductive elements located between the first end and the second end;
   the second transmission line has a first end and a second end and a plurality of inductive elements located between the first end and the second end;
   the first end of the first transmission line is directly electrically connected to the first end of the second transmission line at a first transmission line connection node;
   the pump module is structured, located, programmed and/or connected to pump alternating current electrical energy at a wavelength of $\lambda_p$ to the first and second transmission lines at the first transmission line connection node;
   each capacitor sub-module of the set of capacitor sub-module(s): (i) includes at least one variable capacitor, and (ii) is electrically connected between the first transmission line and the second transmission line; and
   the first transmission line, the second transmission line and the set of capacitor sub-modules are structured and/or connected to produce a signal differential standing wave having a wavelength of $\lambda_s$, which is an integral multiple of $\lambda_p$.

2. The circuit of claim 1 wherein the resonator can operate over a range of $\lambda_p$ values between a minimum $\lambda_p$ value and a maximum $\lambda_p$ value, with the minimum $\lambda_p$ value corresponding to a frequency of at least 5 gigahertz.

3. The circuit of claim 1 wherein the first transmission line, the second transmission line and the set of capacitor sub-module(s) are implemented in a CMOS process.

4. The circuit of claim 1 wherein the resonator circuit is incorporated into one of the following types of larger circuits: a frequency divider, a phase locked loop, or an amplifier.

5. The circuit of claim 1 wherein each capacitor sub-module of the set of capacitor sub-module(s) comprises two variable capacitors connected to each in series at a common node.

6. The circuit of claim 5 wherein each capacitor sub-module of the set of capacitor sub-module(s) further comprises a fixed capacitor electrically connected to the common node.

7. The circuit of claim 6 wherein each fixed capacitor of each capacitor sub-module of the set of capacitor sub-module(s) is electrically connected between the common node and an electrical ground.

8. A resonator circuit comprising:
   a pump module; and
   a plurality of capacitor-inductor modules;
   wherein:
   each capacitor-inductor module of the plurality of capacitor-inductor modules comprises a first inductive element, a second inductive element and a capacitor sub-module;
   the first inductive elements of the plurality of capacitor-inductor modules are electrically connected in series to form a first transmission line;

the second inductive elements of the plurality of capacitor-inductor modules are electrically connected in series to form a first transmission line;

a first end of the first transmission line is directly electrically connected to a first end of the second transmission line at a first transmission line connection node;

the pump module is structured, located, programmed and/or connected to pump alternating current electrical energy at a wavelength of $\lambda_p$ to the first and second transmission lines at the first transmission line connection node;

each capacitor sub-module of the plurality of capacitor-inductor modules comprises two variable capacitors and a fixed capacitor, with the variable capacitors being connected to each other, in series at a common node, between the first and second inductive elements and with the fixed capacitor being electrically connected between the common node and an electrical ground; and the variable capacitors, the fixed capacitors and the inductive elements are structured to produce a signal differential standing wave having a wavelength of $\lambda_s$, which is an integral multiple of $\lambda_p$.

9. The circuit of claim 8 wherein the resonator can operate over a range of $\lambda_p$ values between a minimum $\lambda_p$ value and a maximum $\lambda_p$ value, with the minimum $\lambda_p$ value corresponding to a frequency of at least 5 gigahertz.

10. The circuit of claim 8 wherein the variable capacitors of the capacitor sub-modules are CMOS varactors.

11. The circuit of claim 8 wherein the resonator circuit is incorporated into one of the following types of larger circuits: a frequency divider, a phase locked loop, or an amplifier.

12. The circuit of claim 8 further comprising an additional capacitor sub-module electrically connected between a second end of the first transmission line and a second end of the second transmission line, wherein the additional capacitor sub-module comprises two variable capacitors and a fixed capacitor, with the variable capacitors being connected to each other, in series at a common node, between the second end of the first transmission line and the second end of the second transmission line and with the fixed capacitor being electrically connected between the common node and an electrical ground.

13. The circuit of claim 12 wherein the second end of the first transmission line and the second end of the second transmission line are directly electrically connected to each other.

14. An amplifier circuit comprising:
an input module;
an output module;
a pump module; and
a resonator portion;
wherein:
the resonator portion comprises a first transmission line and a second transmission line;

the input module is electrically connected to the first transmission line and the second transmission line and is structured and/or connected to input an input signal to the first and second transmission lines;

the first end of the first transmission line is directly electrically connected to the first end of the second transmission line at a first transmission line connection node;

the pump module is structured, located, programmed and/or connected to pump alternating current electrical energy at a wavelength of $\lambda_p$ to the first and second transmission lines at the first transmission line connection node;

the resonator portion is structured and/or connected to produce a pump standing wave with a wavelength of $\lambda_p$ and a signal differential standing wave having a wavelength of $\lambda_s$, which is an integral multiple of $\lambda_p$;

the output module is electrically connected to the first transmission line and the second transmission line at a location where there is a zero crossing point in the pump standing wave signal; and the output module is structured and/or connected to receive an output signal from the first and second transmission lines, with the output signal exhibiting noise squeezing.

15. The circuit of claim 14 wherein:
$\lambda_s$ is two times $\lambda_p$;
the signal differential standing wave is one half of $\lambda_s$ in length;
the pump standing wave is $\lambda_p$ in length; and
the output module is connected to the first and second transmission lines at a $(\frac{3}{4})\lambda_p$ position.

16. The circuit of claim 14 wherein the resonator portion and the output module are structured and/or connected so that the amplifier circuit is characterized by a negative noise figure.

* * * * *